United States Patent
Wang et al.

(10) Patent No.: US 12,207,478 B2
(45) Date of Patent: Jan. 21, 2025

(54) MEMORY DEVICE AND METHODS OF FORMING SAME

(71) Applicant: Taiwan Semiconductor Manufacturing Co., Ltd., Hsinchu (TW)

(72) Inventors: Chenchen Jacob Wang, Hsinchu (TW); Sai-Hooi Yeong, Zhubei (TW); Yu-Ming Lin, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 316 days.

(21) Appl. No.: 17/238,678

(22) Filed: Apr. 23, 2021

(65) Prior Publication Data
US 2022/0344402 A1   Oct. 27, 2022

(51) Int. Cl.
| | |
|---|---|
| H10B 61/00 | (2023.01) |
| H01L 21/02 | (2006.01) |
| H01L 29/24 | (2006.01) |
| H10N 50/01 | (2023.01) |

(52) U.S. Cl.
CPC ....... *H10B 61/22* (2023.02); *H01L 21/02565* (2013.01); *H01L 29/24* (2013.01); *H10N 50/01* (2023.02)

(58) Field of Classification Search
CPC ............. H10B 61/00–22; H10N 50/80; H10N 50/85; H10N 50/01; H01L 29/82; G11C 11/14–1697; G11C 11/5607; G11C 14/0036; G11C 14/0045; G11C 19/02–10; G11C 2211/5615–5616; H01F 10/324–3295
See application file for complete search history.

(56) References Cited

U.S. PATENT DOCUMENTS

| | | | |
|---|---|---|---|
| 6,606,263 B1* | 8/2003 | Tang | G11C 11/1675 365/158 |
| 2019/0157345 A1* | 5/2019 | Zhu | H10N 50/85 |

OTHER PUBLICATIONS

X. Yin et al., "Low Leakage Current Vertical Thin-Film Transistors With InSnO-Stabilized ZnO Channel," in IEEE Electron Device Letters, vol. 41, No. 2, pp. 248-251, Feb. 2020, doi: 10.1109/LED.2019.2960883 (Year: 2020).*

* cited by examiner

Primary Examiner — Evren Seven
Assistant Examiner — Cole Leon Lindsey
(74) Attorney, Agent, or Firm — Slater Matsil, LLP

(57) ABSTRACT

In an embodiment, a semiconductor device includes a first dielectric layer over a substrate and a first access transistor and a second access transistor in a memory cell of a memory array, the first access transistor and the second access transistor each including a bottom electrode in the first dielectric layer, a conductive gate in a second dielectric layer, where the second dielectric layer is over the bottom electrode and the first dielectric layer, a channel region extending through the conductive gate to contact the bottom electrode, and a top electrode over the channel region.

20 Claims, 31 Drawing Sheets

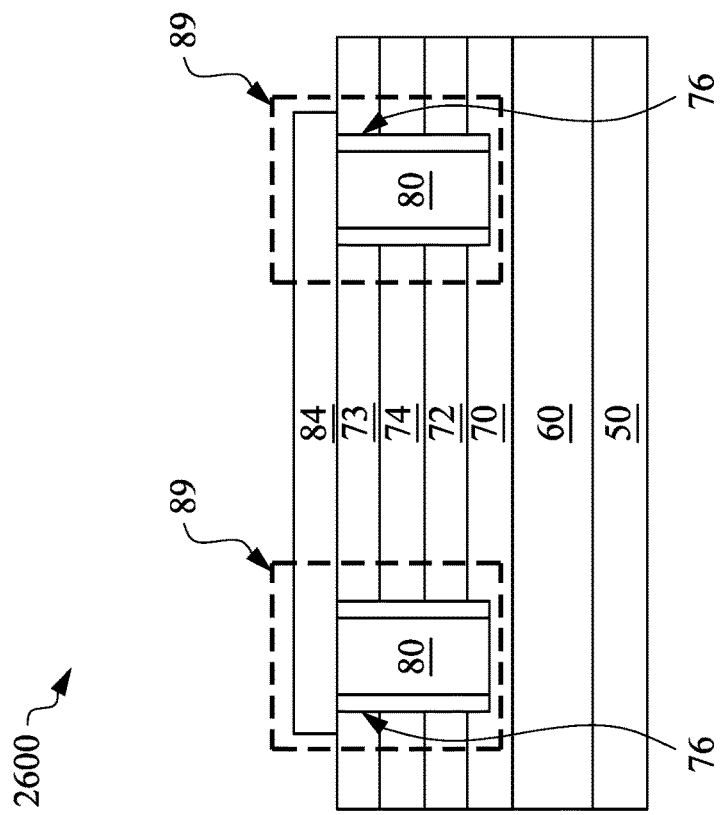
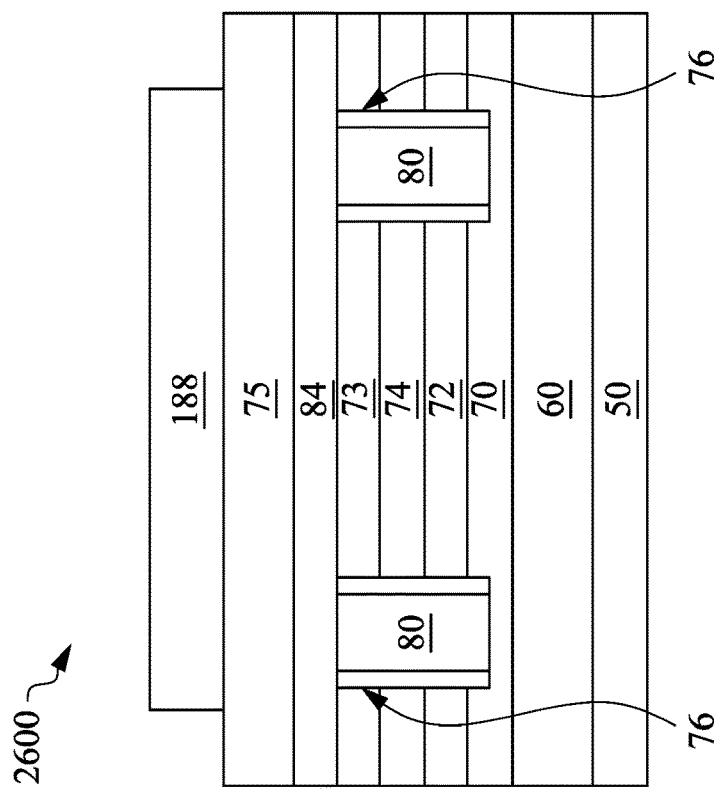
Figure 29A
Figure 29B

MEMORY DEVICE AND METHODS OF FORMING SAME

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them. One type of non-volatile semiconductor memory is magnetoresistive random access memory (MRAM), which involves spin electronics that combines semiconductor technology and magnetic materials and devices. The spins of electrons, through their magnetic moments, are used to indicate bit values. A MRAM cell typically includes a magnetic tunnel junction (MTJ) stack, which includes a pinned magnetic layer, a free magnetic layer, and a tunneling non-magnetic barrier layer between the pinned layer and the free layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 29A through 29G are various views of intermediate stages in the manufacturing of a semiconductor device, in accordance with some embodiments.

DETAILED DESCRIPTION

Figure 2:
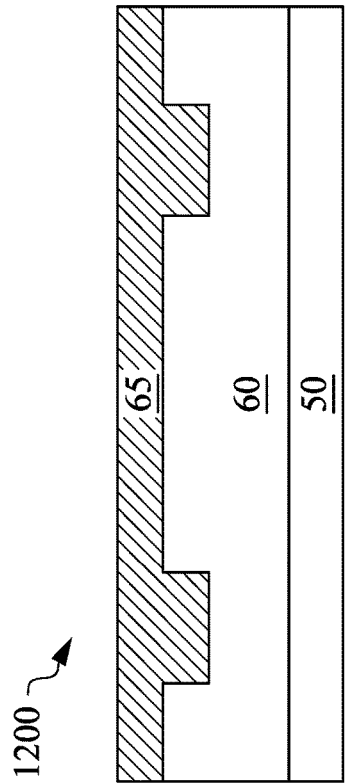
FIGS. 1 through 23 are various views of intermediate stages in the manufacturing of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integration scheme is described that uses a plurality of vertical thin-film transistors (TFTs) connected in parallel as access transistors to provide a drive current for memory technologies. The embodiments of the present disclosure are discussed in the context of forming a Magnetic Tunnel junction (MTJ) device of a memory array. A plurality of vertical TFTs are used to form each MRAM cell of a memory array. However, the methods of the present disclosure may be used to provide a drive current for other types of memory technologies (e.g., phase change random access memory (PCRAM), resistive random access memory (RRAM), or the like).

Various embodiments include forming an MTJ stack and vertical oxide semiconductor TFTs at low temperatures in the Back End of Line (BEOL) of a fabrication process. The oxide semiconductor TFTs have channel materials that are characterized by relatively low leakage currents and higher on-off ratios than silicon based transistors. Embodiments of the present disclosure allow for the customization of device parameters, such as the drive current, allowing for the ability to meet requirements to drive different types of memory technologies and reducing manufacturing costs. Various embodiments allow for a higher available drive current to drive each MTJ of a MRAM cell by using a plurality of vertical TFTs in different configurations. In addition, since the memory array is formed at the BEOL (e.g., in the interconnect layers) instead of the Front End of Line (FEOL) (e.g., on a top surface of a semiconductor substrate), additional space in the FEOL is available for another purpose and therefore allows for a higher integration density. For example, one or more logic arrays can be formed in the additional space that is not occupied by the memory array in the FEOL. In such embodiments, the one or more logic arrays in the FEOL may be disposed under the memory array formed in the BEOL. Further, the embodiments allow for the formation of multi-stack memory arrays in the BEOL through the use of monolithic integration.

FIGS. 1-23 illustrate cross-sectional and top-views of intermediate stages in the manufacture of a semiconductor device 1200, in accordance with an embodiment. The semiconductor device 1200 comprises a memory array that has a plurality of memory cells. Each memory cell comprises a MTJ coupled to a plurality of vertical TFTs formed in a Back End of Line (BEOL) of a fabrication process.

Figure 1:
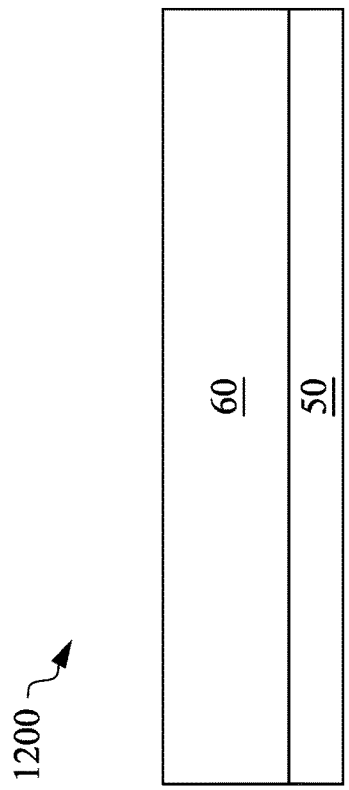

FIG. 1 illustrates an insulation material 60 being formed over a substrate 50. The insulation material 60 may be an oxide, such as silicon oxide, a nitride, the like, or a combination thereof, and may be formed by a chemical vapor deposition (CVD) process, physical vapor deposition (PVD) process, atomic layer deposition (ALD) process, or the like. Other insulation materials formed by any acceptable process may be used.

The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In some embodiments, there are no active devices (e.g., transistors) at the Front End of Line (FEOL) (e.g., on a top surface of the substrate 50) In some embodiments of the present disclosure, substrate 50 may comprise a logic region that is comprised of one or more logic devices (e.g., active devices for integration into logic circuits, or the like) formed over a semiconductor substrate. The logic region can be formed in a FEOL fabrication process. Subsequently, MRAM cells of a memory array can then be formed over the logic region in a BEOL fabrication process.

Figure 3B:
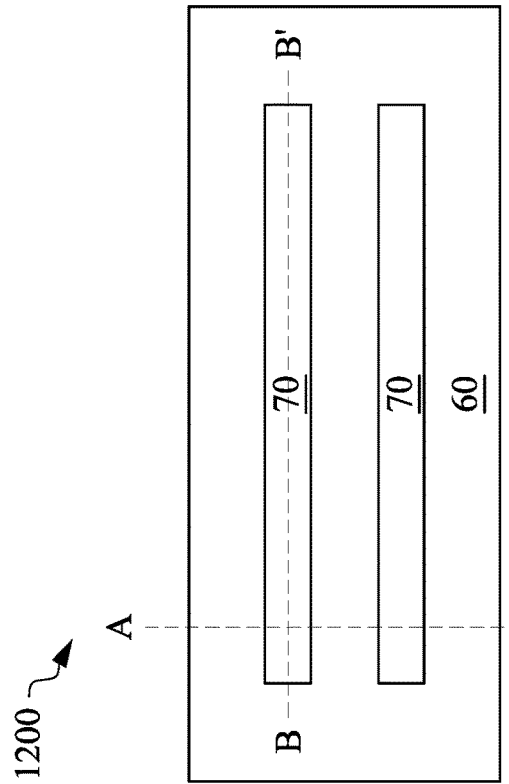

FIGS. 2 through 3B illustrate the formation of bottom electrodes 70 in the insulation material 60 in accordance with some embodiments. The bottom electrodes 70 may include one or more conductive strips. In FIG. 2, trenches are formed in the insulation material 60. The trenches may be formed using acceptable photolithography and etching techniques. A conductive material 65 may be then deposited in the trenches using CVD, physical vapor deposition (PVD), atomic layer deposition (ALD), electro-chemical plating (ECP), electroless plating, or the like. The conductive material 65 may be formed of conductive materials such as Cu, Al, Ti, Ta, W, Pt, Ni, Cr, Ru, TiN, TaN, combinations thereof, multilayers thereof, or the like.

Figure 3A:
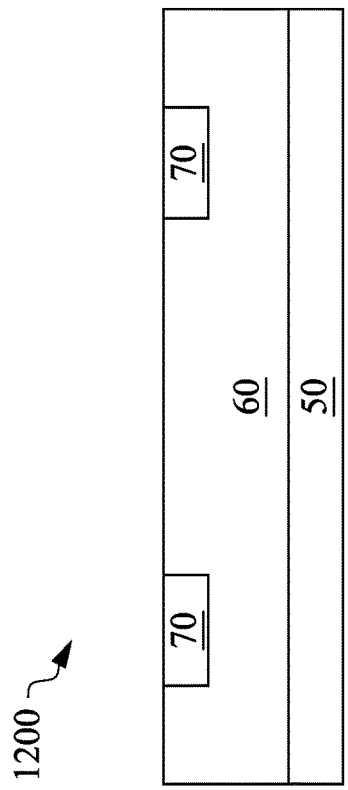

In FIG. 3A, a planarization process, such as a CMP, may be performed to remove excess conductive material 65 from a surface of the insulation material 60. The remaining conductive material 65 forms the bottom electrodes 70 in the trenches. FIG. 3B illustrates a top-view of the structure described earlier in FIG. 3A, where the cross-sectional view of FIG. 3A is taken along line A-A' of FIG. 3B. As illustrated in FIG. 3A, the bottom electrodes 70 comprise one or more conductive strips in the insulation material 60.

Figure 4A:
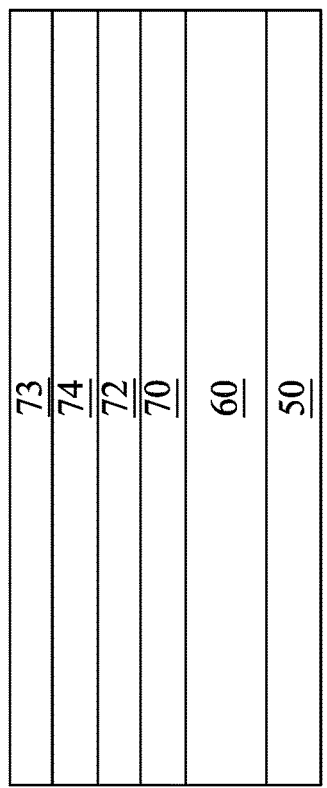

FIG. 4A illustrates the formation of a conductive metal gate 74 in a dielectric layer 72. The dielectric layer 72 is formed over the insulation material 60 and the bottom electrodes 70, and the dielectric layer 72 may comprise silicon oxide, a nitride (e.g., silicon nitride, silicon carbon nitride, or the like), an oxynitride, or the like formed by a CVD, PVD, ALD, or other suitable process. Next, a trench is formed through the dielectric layer 72. The trench may be formed by acceptable photolithography and etching techniques, such as a damascene patterning process. A conductive material may be then deposited in the trench to form the conductive metal gate 74. The metal gate 74 may comprise a metal-containing material such as Cu, Al, Ti, Ta, W, Pt, Ni, Cr, Ru, TiN, TaN combinations thereof, or the like and may be formed by a CVD, PVD, ALD, or other suitable process. A planarization process, such as a CMP, may be performed to remove excess conductive material from a surface of the dielectric layer 72. The remaining conductive material forms the metal gate 74 in the trench. In another embodiment, metal gate 74 can be directly deposited on dielectric layer 72 without trench, and the memory area can be defined in subsequent steps together when the isolation structure 88 is formed in FIG. 13A.

Figure 4B:
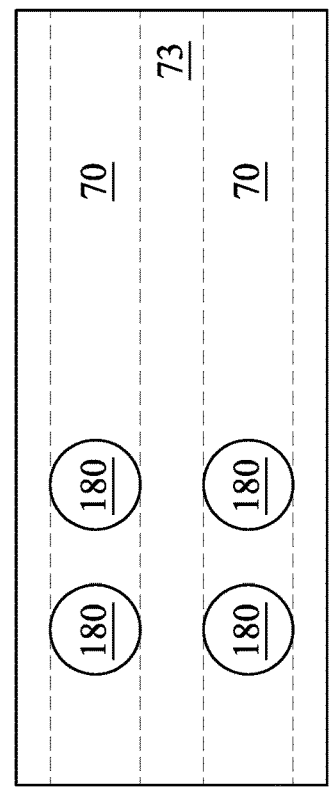

In FIG. 4B, a cross-sectional view is illustrated along a line similar to B-B' of FIG. 3B, after a dielectric layer 73 is formed over the metal gate 74 and the gate dielectric layer 72. The dielectric layer 73 may be formed of a similar material and in a similar manner as the dielectric layer 72. The dielectric layer 72 may have a same or a different material composition as the dielectric layer 73.

Figure 5:
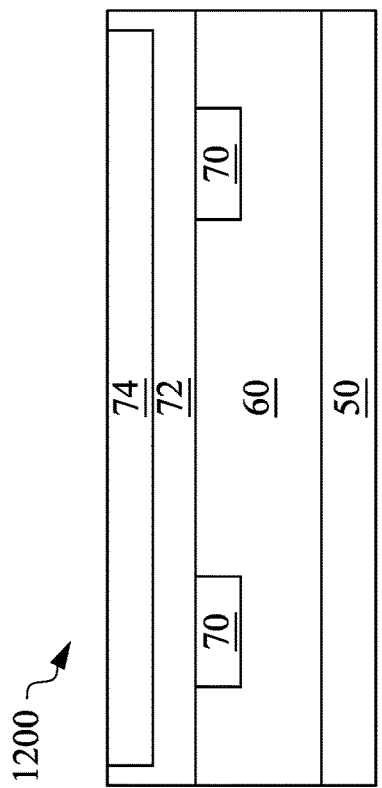
Figure 6:
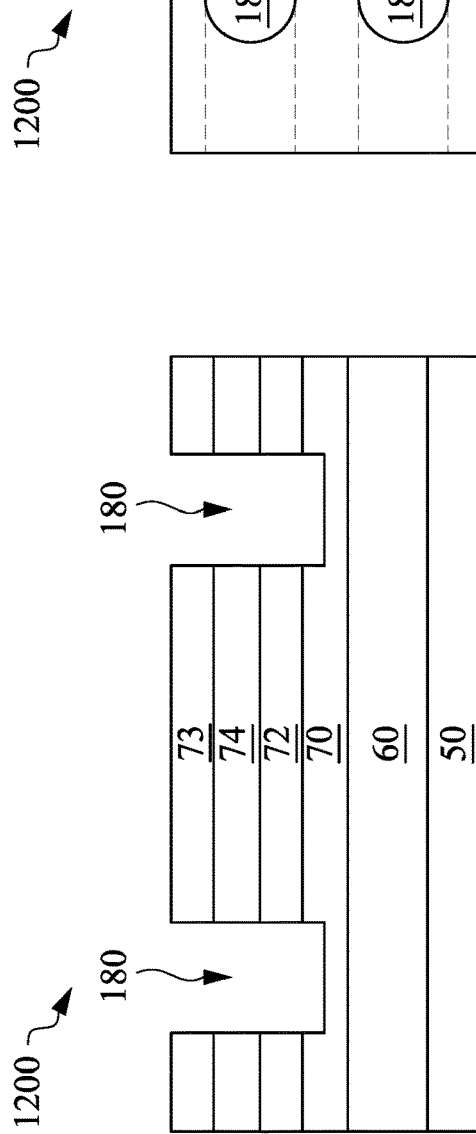

FIG. 5 illustrates the formation of openings 180 in the dielectric layer 73, the conductive metal gate 74, the dielectric layer 72, and the bottom electrodes 70. The openings 180 may be formed using acceptable photolithography and etching techniques. For example, anisotropic etching can be used to form the openings 180 that extend through the dielectric layer 73, the metal gate 74, the dielectric layer 72, and into the bottom electrodes 70. After forming the openings 180, top surfaces of the bottom electrodes 70 are exposed. Although two openings 180 are illustrated in FIG. 5, any number of the openings 180 can be formed to meet the requirements of alternative embodiments. For example, FIG. 6 illustrates a top-view of the semiconductor device 1200 after the formation of four openings 180 that expose top surfaces of the bottom electrodes 70. In FIG. 6, the location of the bottom electrodes 70 is shown in ghost. Fewer or a greater number of openings 180 may be formed in other embodiments.

Figure 7:
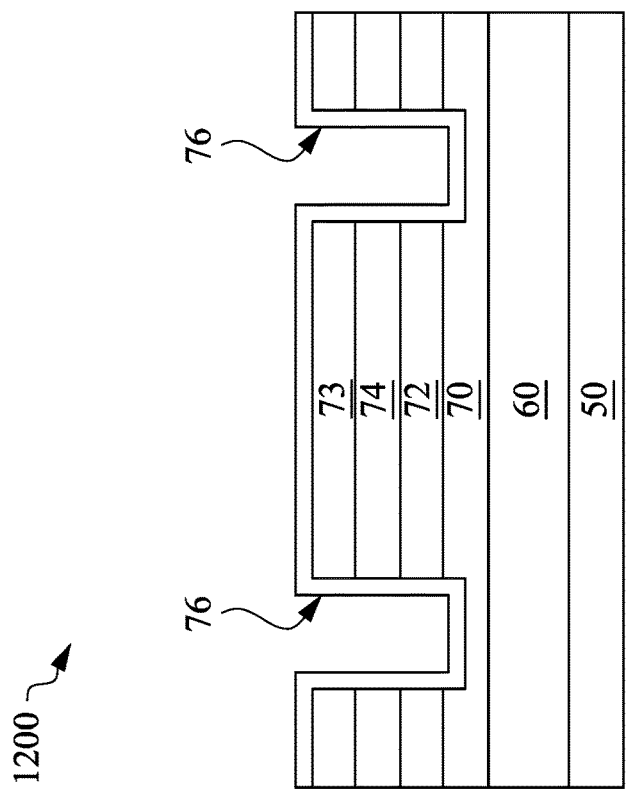

FIG. 7 illustrates the formation of a gate dielectric layer 76 in the openings 180. Gate dielectric layer 76 is deposited conformally in the openings 180, such as on the top surfaces and sidewalls of the bottom electrodes 70, sidewalls of the dielectric layer 72, sidewalls of the metal gate 74, and sidewalls of the dielectric layer 73. The gate dielectric layer 76 may also be formed on the top surface of the dielectric layer 73. In some embodiments, the gate dielectric layer 76 may comprise one or more dielectric layers, such as one or more layers of silicon oxide, silicon nitride, metal oxide, metal silicate, or the like. In some embodiments, the gate dielectric layer 76 may comprise a high-k dielectric material, such as a metal oxide or a silicate of hafnium, aluminum, zirconium, lanthanum, manganese, barium, titanium, lead, and combinations thereof. The gate dielectric layer 76 may include a dielectric layer having a k value greater than about 7.0. The formation methods of the gate dielectric layer 76 may include Molecular-Beam Deposition (MBD), ALD, PECVD, and the like.

Figure 8:
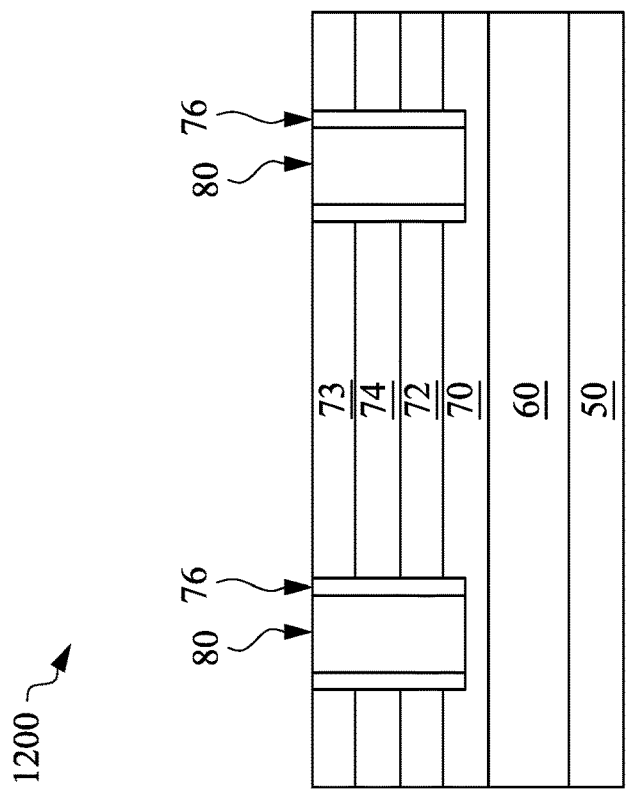

FIG. 8 illustrates the removal of a portion of the gate dielectric 76 in the opening 180. For example, anisotropic etching may be used to selectively remove horizontal portions of the gate dielectric 76 in the opening 180 and on the top surface of the dielectric layer 73 while the vertical portions of the gate dielectric 76 on the sidewalls of the bottom electrodes 70, the dielectric layer 72, the dielectric layer 73 and the metal gate 74, are left relatively intact. After the etching, a top surface of the bottom electrodes 70 in the opening 180 is exposed.

Next, a semiconductor layer 80 is formed in the openings 180. Semiconductor layer 80 may comprise an oxide semiconductor thin film, such as, indium-gallium-oxide (IGO), zinc oxide (ZnO), indium-gallium-zinc-oxide (IGZO), indium-tungsten-oxide (IWO), or the like. The formation methods of the semiconductor layer 80 may include CVD, ALD, pulse laser deposition (PLD), magnetron sputtering, or the like. After the semiconductor layer 80 is deposited, a planarization process, such as a CMP, may be performed to remove excess material of the semiconductor layer 80 from a surface of the dielectric layer 73. As a result of the planarization, a top surface of the dielectric layer 73 and a top surface of the semiconductor layer 80 are substantially level (e.g., within manufacturing tolerances). The semiconductor layer 80 forms channels for subsequently formed oxide semiconductor vertical thin-film-transistors (TFTs). The vertical TFT is so named because a current in the channel will mainly travel in a vertical direction in a plane perpendicular to a major surface of the substrate 50 when the transistor is in the on-state. Oxide semiconductor TFTs have advantages, such as having low leakage currents. For example, leakage currents may be in a range from $1 \times 10^{-13}$ A to $1 \times 10^{-15}$ A. Oxide semiconductor TFTs also have higher on-off ratios than typical silicon based transistors and can be formed at lower process temperatures. The oxide semiconductor process temperature may be in a range from about 100° C. to about 350° C. Their low process temperature allows the oxide semiconductor TFTs to be formed in the BEOL (e.g., in the interconnect layers over the substrate 50) of a fabrication process where higher process temperatures cannot be used. The formation of contemporary metal oxide semiconductor (CMOS) transistors instead of oxide semiconductor TFTs typically requires high temperatures to create doped areas of the transistors. These high temperatures may cause the metals in the BEOL (e.g., in the interconnect layers over the substrate 50) that are used to interconnect the transistors to contaminate the devices as well as causing performance degradation.

Figure 9:
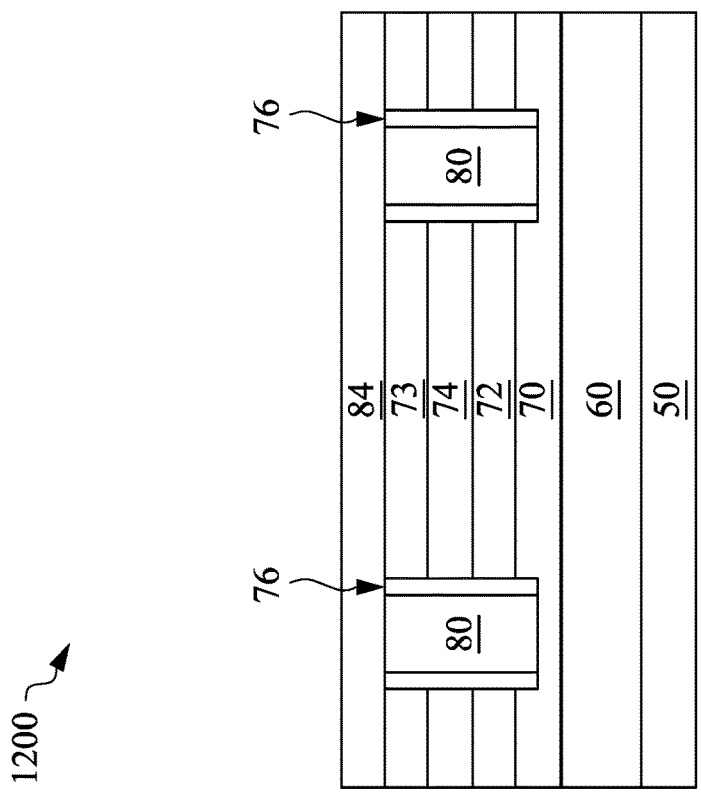

FIG. 9 illustrates a top electrode 84 is formed over the dielectric layer 73 and the semiconductor layer 80, in accordance with some embodiments. The top electrode 84 may be formed using CVD, physical vapor deposition (PVD), electro-chemical plating (ECP), electroless plating, or the like and may be formed of conductive materials such as Cu, Al, Ti, Ta, W, Pt, Ni, Cr, Ru, TiN, TaN, combinations thereof, multilayers thereof, or the like. In some embodiments, the top electrode 84 may have a same material composition as the bottom electrode 70.

Figure 10:
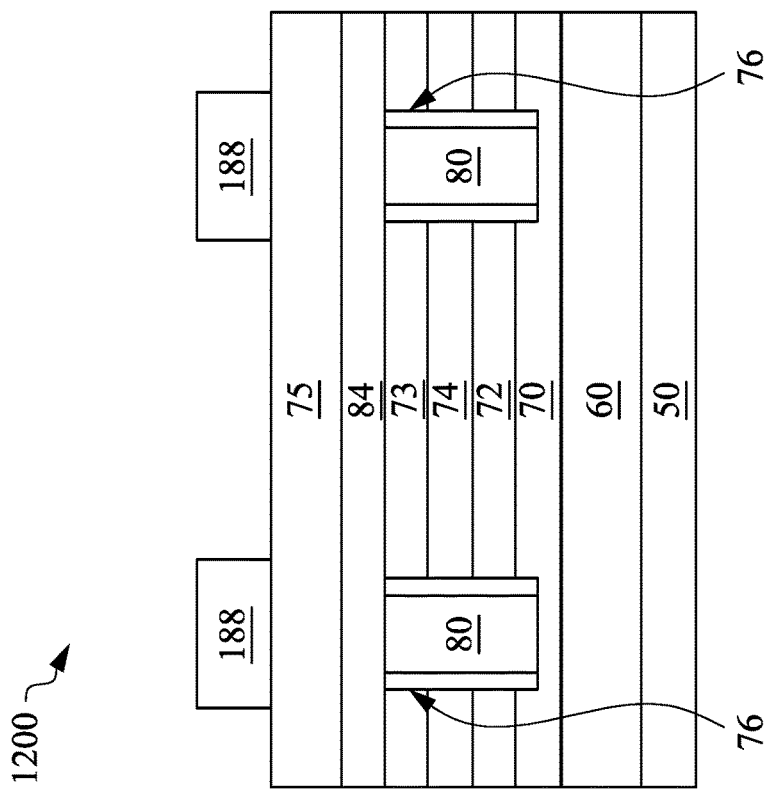

FIG. 10 illustrates a first interlayer dielectric (ILD) 75 deposited over the structure illustrated in FIG. 9. The first ILD 75 may be formed of a dielectric material, and may be deposited by any suitable method, such as CVD, plasma-enhanced CVD (PECVD), or FCVD. The first ILD 75 may comprise phospho-silicate glass (PSG), boro-silicate glass (BSG), boron-doped phospho-silicate glass (BPSG), undoped silicate glass (USG), or the like. Other insulation materials formed by any acceptable process may be used.

Next, a photoresist 188 may be deposited over the first ILD 75, which is then patterned to form openings. This can be achieved, for example, blanket depositing a photosensitve layer (e.g., through sputtering or the like) and patterning the photosensitive layer through photolithography. For example, patterning the photoresist 188 may be performed using a combination of exposure, development, and/or cleaning processes.

Figure 11:
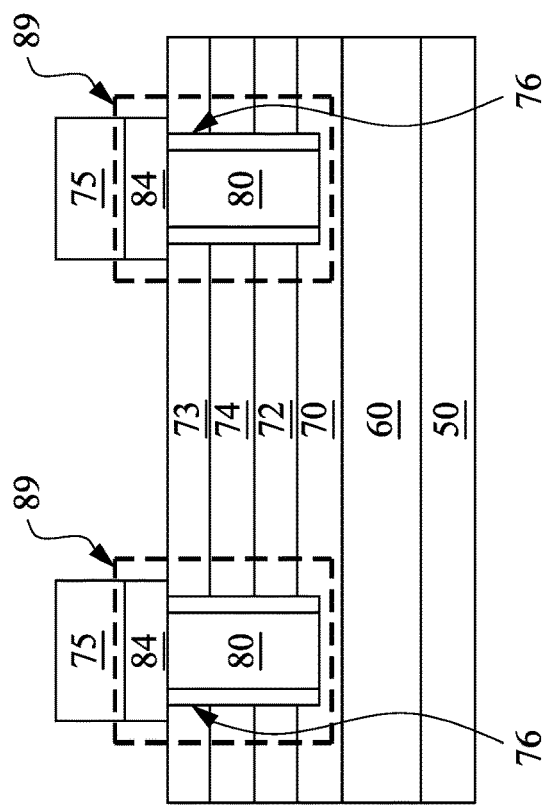

FIG. 11 illustrates the use of the patterned photoresist 188 as an etching mask to etch the first ILD 75. The pattern of the photoresist 188 is transferred to the first ILD 75. The remaining photoresist 188 can then be removed by a suitable method (e.g., ashing). The first ILD 75 is then used as an etching mask to etch the top electrode 84. After the etching, portions of the top electrode 84 and the first ILD 75 may remain over top surfaces of the semiconductor layer 80, the gate dielectric 76 and the dielectric layer 73.

The bottom electrodes 70 function as a source line for subsequently formed MTJs (shown subsequently in FIG. 22). The bottom electrodes 70 and the top electrode 84 form a source and drain for each vertical TFT 89. The cross-sectional view illustrated in FIG. 11 shows the TFTs 89 having a channel made from the semiconductor layer 80, which comprises a thin-film oxide semiconductor. Each of the TFTs 89 has the top electrode 84 (drain) above the bottom electrode 70 (source), and a current in the channel (e.g., semiconductor layer 80) will mainly travel in a vertical direction along a plane perpendicular to a major surface of the substrate 50 when the TFT 89 is in the on-state. The metal gate 74 functions as a word line for subsequently formed MTJs (shown subsequently in FIG. 22).

Figure 12:
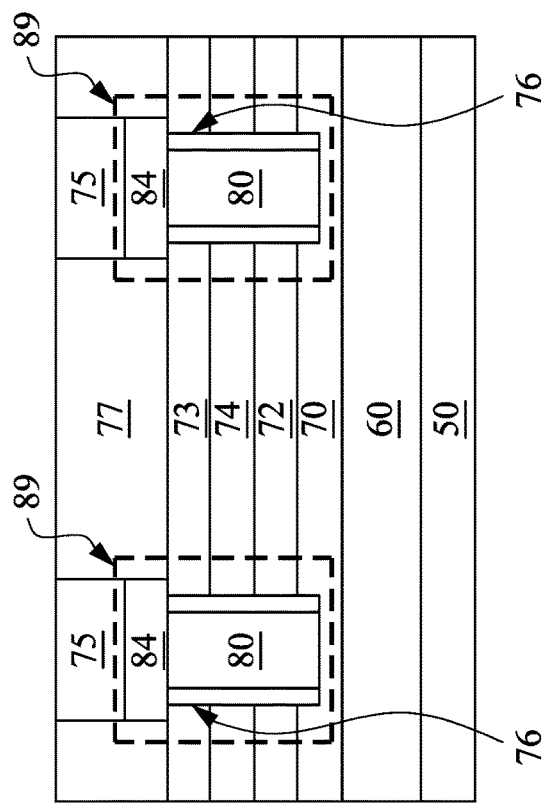

FIG. 12 illustrates the second interlayer dielectric (ILD) 77 being deposited over the structure illustrated in FIG. 11 to fill spaces that were left after the etching of the top electrode 84 and the previously formed first ILD 75 (described previously in FIG. 11). The second ILD 75 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The second ILD 77 may have a same or a different material composition as the first ILD 75. The first ILD 75 and the second ILD 77 may subsequently have their thickness reduced by use of a planarization process, such as a CMP for example.

Figure 13B:
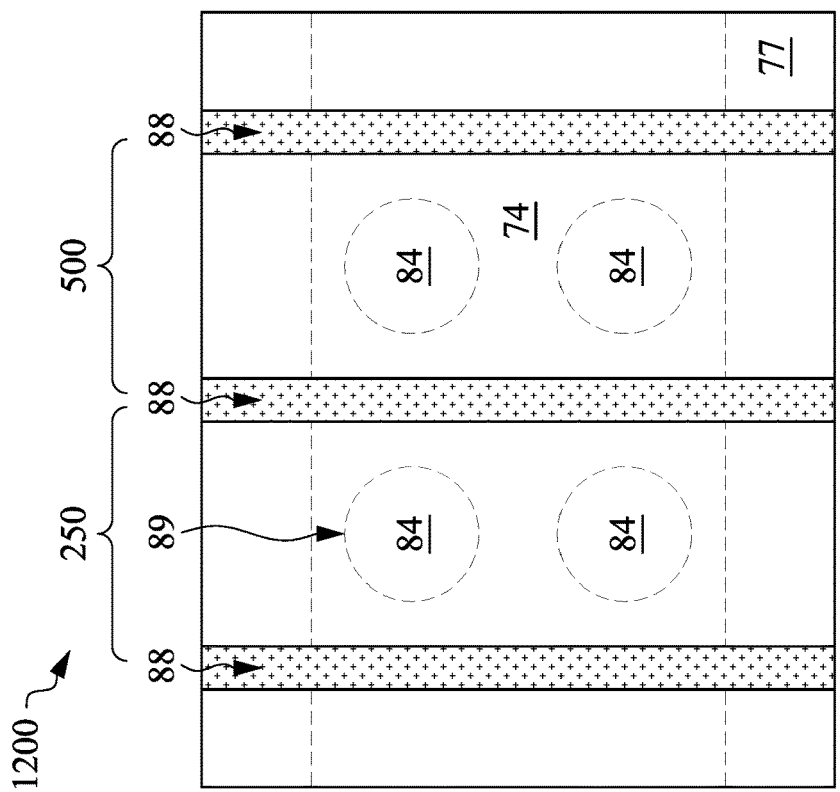
Figure 13A:
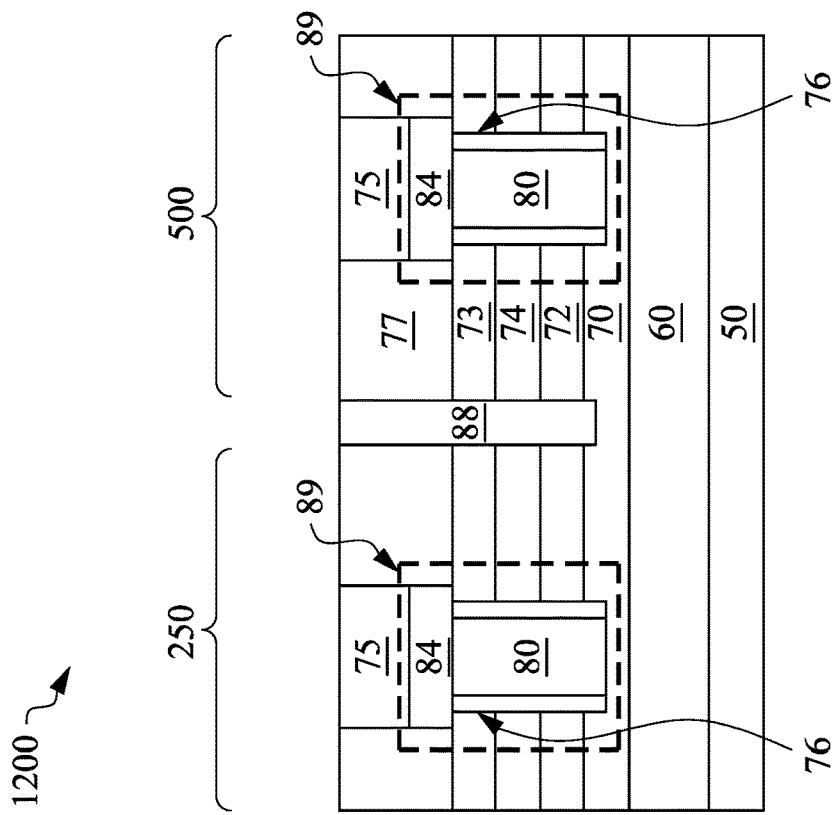

FIG. 13A illustrates the formation of isolation structures 88 in accordance with some embodiments. The second ILD 77, the dielectric layer 73, the metal gate 74 and the dielectric layer 72 are etched to form trenches. In some embodiments, the trenches may extend to an intermediate level of the bottom electrodes 70. The trenches may be formed by acceptable photolithography and etching techniques, for example. The trenches may be then filled with a dielectric material which may be silicon nitride, silicon oxide, silicon oxynitride, or the like, and may be formed by an ALD, CVD, or the like process. Subsequently, a planarization process, such as a CMP, may be performed to remove excess dielectric material from a surface of the second ILD 77, thus defining the isolation structures 88. The isolation structures 88 extend along a lengthwise direction, which is perpendicular to the lengthwise direction of the metal gate 74. The isolation structures 88 extend through the metal gate 74 and electrically isolate a portion of the metal gate 74 in a first region 250 of the semiconductor device 1200, from a portion of the metal gate 74 in a second region 500 of the semiconductor device 1200.

FIG. 13B illustrates a top-view of an intermediate stage in the manufacture of the semiconductor device 1200 after the formation of the isolation structures 88. The metal gate 74 in the first region 250 is electrically isolated from the metal gate 74 in the second region 500 by the isolation structures 88. TFTs 89 in the first region 250 share an electrically connected metal gate 74 and TFTs 89 in the second region 500 share an electrically connected metal gate 74. The location of the TFTS 89 and the metal gate 74 is shown in ghost.

Figure 14:
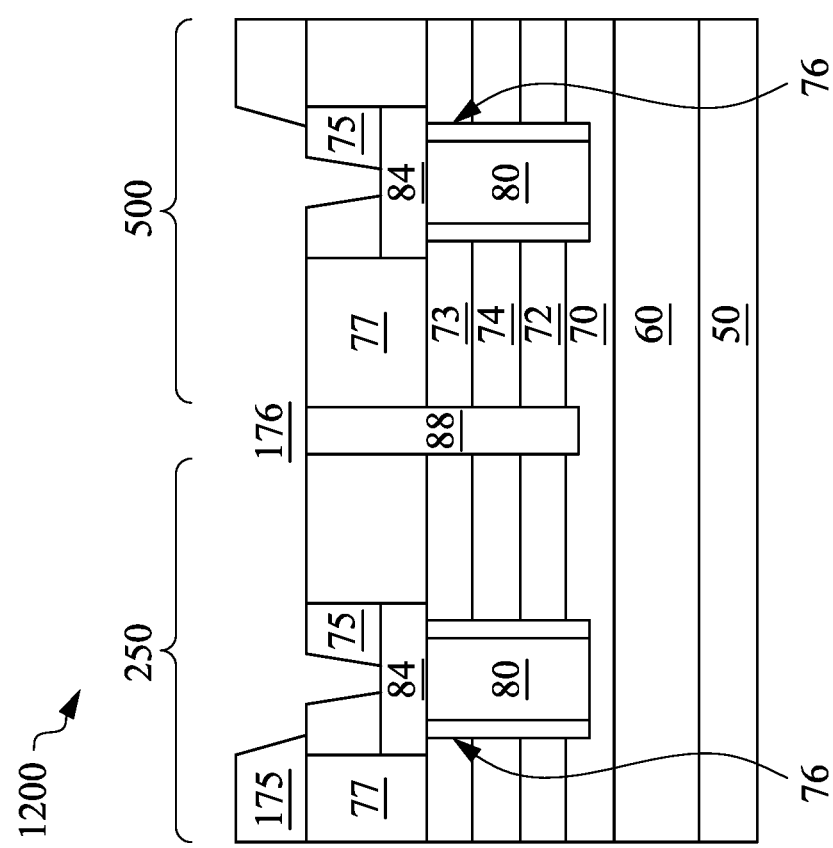

FIG. 14 illustrates the formation of a third ILD 175 over the structure illustrated in FIG. 13A through 13B. The third ILD 175 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The third ILD 175 may be formed of the same material as the first ILD 75 and the second ILD 77.

Next, an opening 176 is formed through the third ILD 175 and first ILD 75. The opening 176 extends to and exposes the top electrodes 84 in the first region 250 and the second region 500. The opening 176 may be formed by acceptable photolithography and etching techniques, such as a dual damascene patterning process. The opening 176 in the third ILD 175 spans across the first region 250, the second region 500, and over the isolation structure 88, and the opening 176 in the first ILD 75 include separate via openings that each extend to the top electrodes 84 in the first region 250 and the second region 500.

Figure 15:
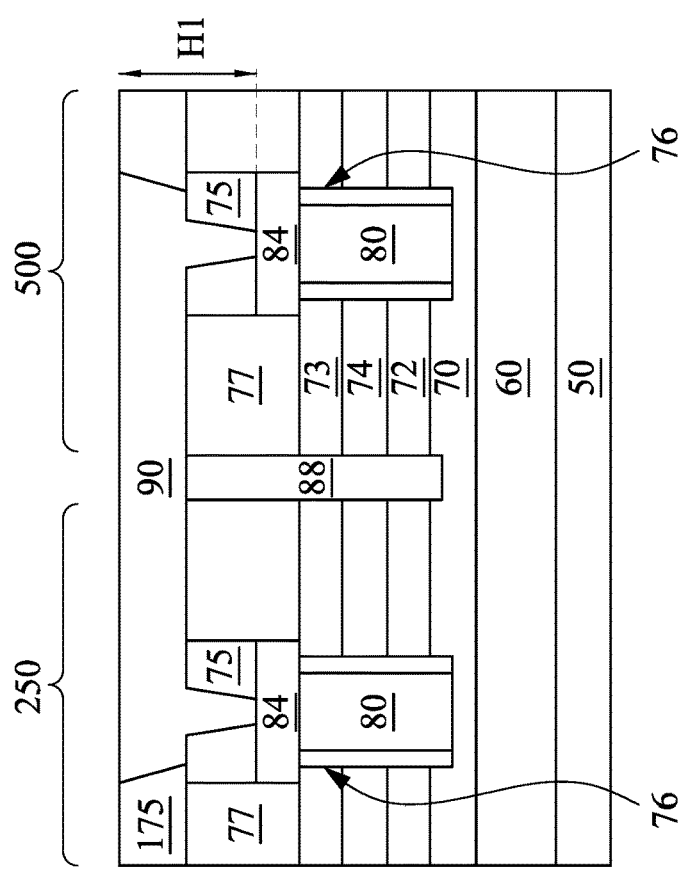

FIG. 15 illustrates the formation of a conductive feature 90 in the opening 176, for example, in a dual damascene process. The conductive feature 90 may be formed using CVD, physical vapor deposition (PVD), electro-chemical plating (ECP), electroless plating, or the like and may be formed of conductive materials such as Cu, Al, Ti, Ta, W, Pt, Ni, Cr, Ru, TiN, TaN, combinations thereof, multilayers thereof, or the like. Excess portions of the conductive feature 90 above the opening 176 may be removed by using a planarization process such as a CMP, or the like. The planarization process may remove excess conductive feature 90 from above a top surface of the third ILD 175. Hence, top surfaces of the conductive feature 90 and the third ILD 175 may be substantially level (e.g., within manufacturing tolerances). The conductive feature 90 may be referred to as a contact, conductive line, conductive pad, via, etc. The conductive feature 90 electrically connects a TFT 89 in the first region 250 of the semiconductor device 1200 to a TFT 89 in the second region 500 of the semiconductor device 1200.

A height H1 of the conductive feature 90 may be adjusted to allow the positioning of a subsequently formed memory element 100 (described subsequently in FIGS. 17 through 18) to be controlled. This allows the memory element 100 to be formed at different positions in the BEOL to meet design and space requirements.

Figure 16:
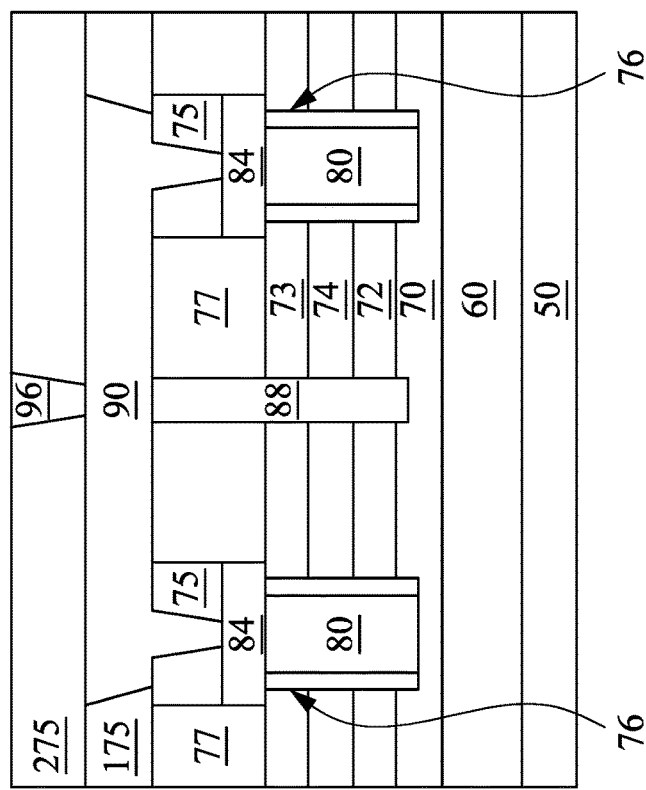

FIG. 16 illustrates the formation of a fourth ILD 275 deposited over the structure illustrated in FIG. 15. The fourth ILD 275 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The fourth ILD 275 may be formed of the same material as the first ILD 75, the second ILD 77, and the third ILD 175.

Next, contact via 96 is formed through the fourth ILD 275 in accordance with some embodiments. An opening for the contact via 96 is formed through fourth ILD 275 to expose the conductive feature 90. The opening may be formed using acceptable photolithography and etching techniques. A conductive material is formed in the opening that may comprise titanium nitride, tungsten, tantalum nitride, copper or the like. A planarization process, such as a CMP, may be performed to remove excess conductive material from a surface of the fourth ILD 275. The remaining conductive material forms the contact via 96 in the opening.

Figures 17, 18:
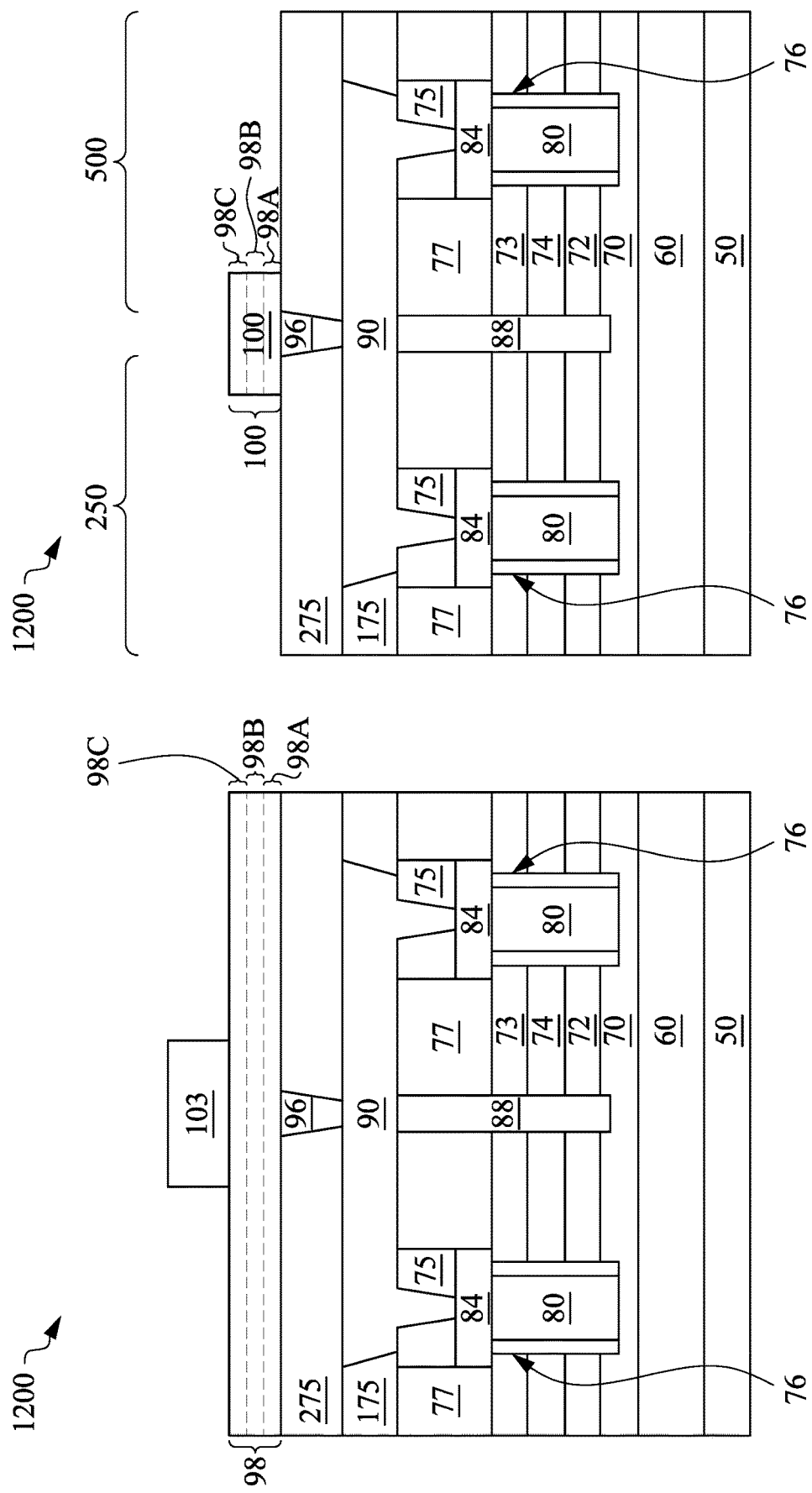

FIG. 17 illustrates the formation of a memory stack 98 over the fourth ILD 275 and the contact via 96. The memory stack 98 may comprise an MRAM magnetic tunnel junction (MTJ) stack, which may include a pinned magnetic layer 98A, a free magnetic layer 98C, and a tunneling non-magnetic barrier layer 98B between the pinned magnetic layer 98A and the free magnetic layer 98C. Each of the pinned magnetic layer 98A and the free magnetic layer 98C comprises a suitable magnetic material(s), such as cobalt iron boron (CoFeB), cobalt iron (CoFe), nickel iron (NiFe), a synthetic magnetic material comprising Co/Ru/Co, or the like. In an embodiment, the tunneling non-magnetic barrier layer 98B comprises magnesium oxide (MgO), or the like. Each of layers may be formed by way of deposition processes such as CVD, PVD, atomic layer deposition (ALD), or the like.

Next, a mask layer 103 may be deposited over the memory stack 98. Mask layer 103 may be a hard mask layer, comprising for example, silicon nitride, silicon oxynitride, or the like. The mask layer 103 may be patterned according to a subsequently formed photoresist layer over the mask layer 103 that may be patterned using lithographic methods.

FIG. 18 illustrates the formation of the memory element 100 by using the patterned mask layer 103 as an etching mask to etch the memory stack 98. The pattern of the mask layer 103 is transferred to the memory stack 98. After the etching, the memory element 100 remains over top surfaces of the fourth ILD 275 and the contact via 96. The remaining mask layer 103 can then be removed by a suitable method (e.g., ashing). The memory element 100 is electrically connected to a vertical TFT 89 in the first region 250 and a vertical TFT 89 in the second region 500 (also described subsequently in the circuit diagram of FIG. 24C) through the contact via 96 and the conductive feature 90. The vertical TFT 89 in the first region 250 and the vertical TFT 89 in the second region 500 are connected to each other in parallel. Although the memory element 100 is described as an MTJ interconnected to a plurality of vertical TFTs 89 that act as access transistors to the MTJ, alternate embodiments of the present disclosure allow for the interconnection of the vertical TFTs 89 as access transistors for other types of memory technologies (e.g., PCRAM, RRAM, or the like).

Figure 19:
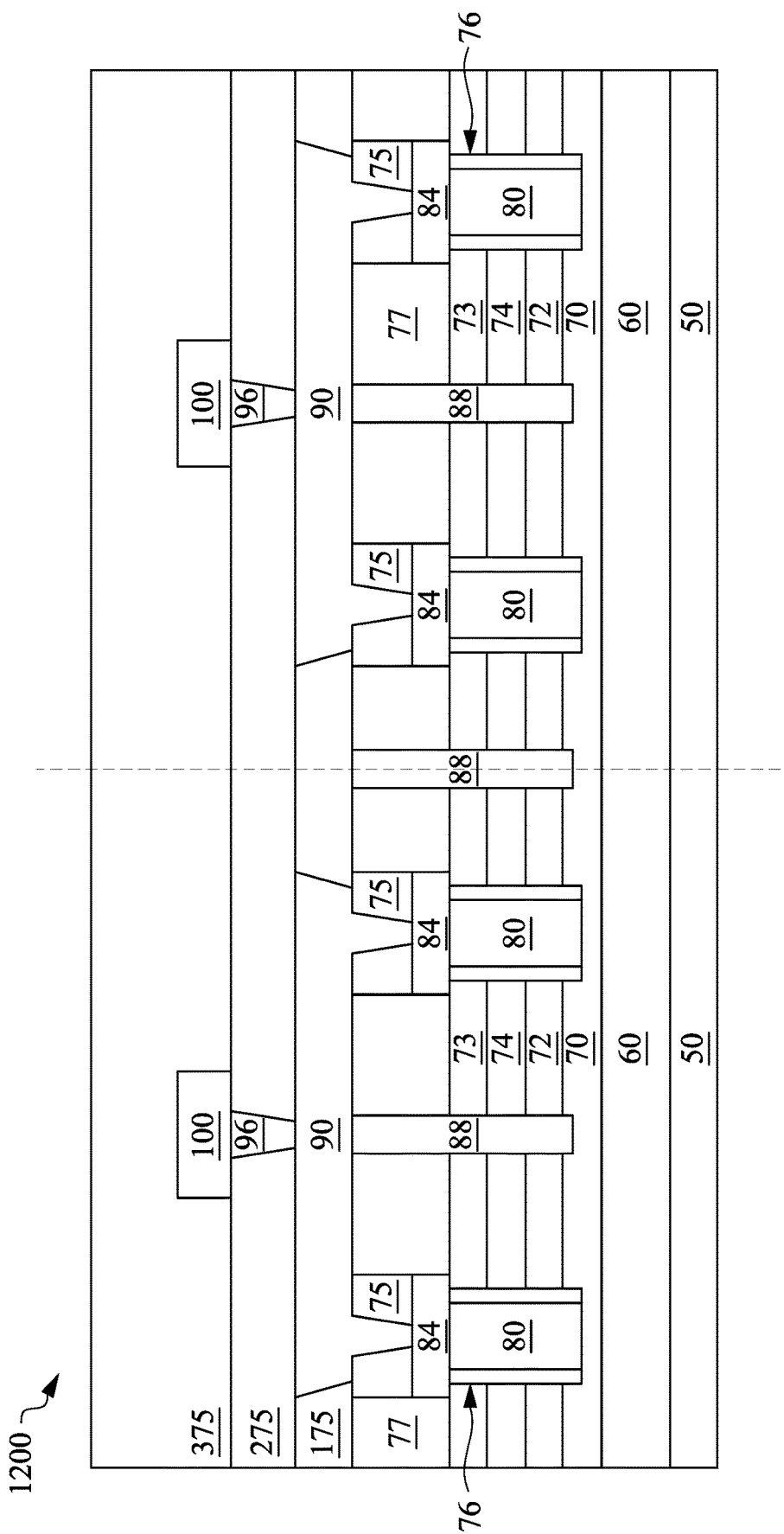

FIG. 19 illustrates the formation of a fifth ILD 375 over two memory cells of the semiconductor device 1200. The memory cells are formed adjacent to each other as part of a wafer, for example. The semiconductor device 1200 may comprise a memory array of memory elements 100 and vertical TFTs 89 as described above. The fifth ILD 375 surround each memory element 100 of the semiconductor device 1200. The fifth ILD 375 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The fifth ILD 375 may be formed of the same material as the first ILD 75, the second ILD 77, the third ILD 175, and the fourth ILD 275. The fifth ILD 375 may subsequently have its thickness reduced by use of a planarization process, such as a CMP for example.

Figure 20:
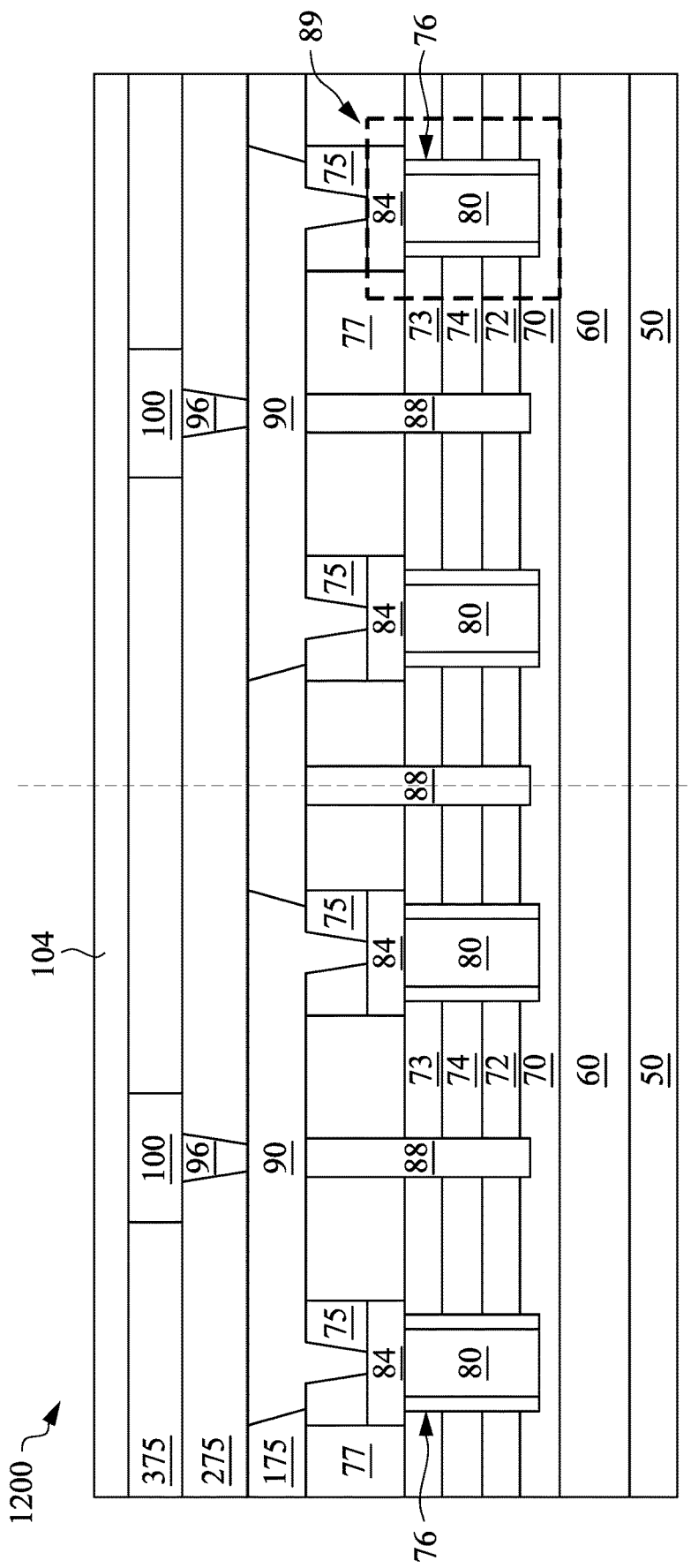

FIG. 20 illustrate the formation of a bit line 104 in the fifth ILD 375 of the structure illustrated in FIG. 19, in accordance with some embodiments. Although the bit line 104 is illustrated as being over the fifth ILD 375, the bit line 104 and the fifth ILD 375 may have top surfaces that are substantially level (e.g., within manufacturing tolerances). The bit line 104 may comprise a conductive strip. More than one bit line 104 may be formed, in accordance with embodiments. Trenches may be formed in the fifth ILD 375. The trenches may be formed using acceptable photolithography and etching techniques. The trenches may then be filled with a conductive material using CVD, physical vapor deposition (PVD), electro-chemical plating (ECP), electroless plating, or the like. The conductive material may comprise a material such as Cu, Al, Ti, Ta, W, Pt, Ni, Cr, Ru, TiN, TaN, combinations thereof, multilayers thereof, or the like. Any excess conductive material may be removed by, for example, a planarization process such as a chemical mechanical polish (CMP) process. The bit line 104 extends along a lengthwise direction, which is parallel to the lengthwise direction of the metal gate 74. The bit line 104 is coupled to the memory elements 100 of the adjacent memory cells of the semiconductor device 1200.

Figure 21:
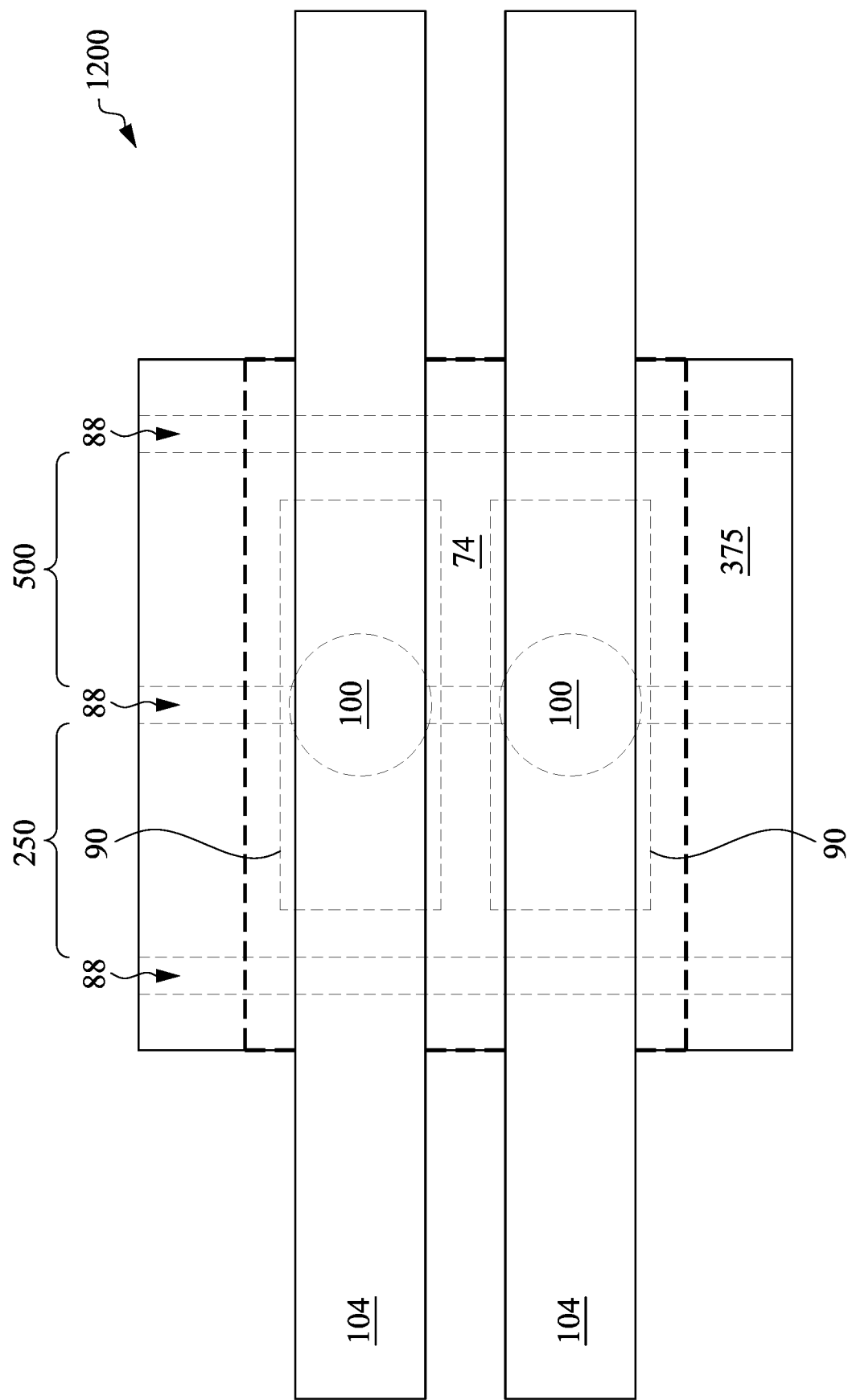

FIG. 21 illustrates a top-view of the semiconductor device 1200 after the formation of the bit lines 104. In FIG. 21, the location of the isolation structures 88, the metal gate 74, the conductive feature 90, and the memory element 100 are shown in ghost. The semiconductor device 1200 comprises a first memory cell adjacent to a second memory cell, each of which comprises a separate bit line 104, in the form of a strip. Each bit line 104 spans the first region 250 and the second region 500 and is coupled to a memory element 100 that is electrically connected to one TFT 89 in the first region 250 and one TFT 89 in the second region 500. In this way, each memory element 100 of the semiconductor device 1200 is coupled to two vertical TFTs 89 that are connected in parallel to each other that provide a drive current for the memory element 100.

It has been observed that providing an integration scheme that uses a plurality of vertical oxide semiconductor thin-film transistors (TFTs) formed at low temperatures that may be in a range from about 100° C. to about 350° C. in the Back End of Line (BEOL) (e.g., in the interconnect layers over a substrate) of a fabrication process and connected in parallel as access transistors to provide a drive current for memory technologies has advantages. For example, providing only a single transistor may lead to an insufficient drive current available to drive each MTJ of a MRAM cell in a memory array. Providing transistors that are formed in the Front End of Line (FEOL) (e.g., on a top surface of a semiconductor substrate), will reduce the amount of space available in the FEOL that could have been used for another purpose and would lead to a reduced integration density.

In some embodiments, the semiconductor device 1200 is formed in a memory region to form a memory array configured to store data bits. Each MRAM memory element 100 of a semiconductor device 1200 is coupled between a bit line 104 and top electrodes 84 (drains) of a plurality of electrically connected vertical TFTs 89. The MRAM memory element 100 may be a MTJ comprising a pinned magnetic layer, a free magnetic layer, and a tunneling non-magnetic barrier layer between the pinned layer and the free layer. The metal gate 74 functions as a word line, and the bottom electrodes 70 (source) of the TFTs 89 function as source lines. To write the data bits, a positive voltage is applied on the metal gate 74 to turn on the TFT. A differential voltage is applied between the source line 70 and the bit line 104 to enable the current flow and enabling a switching event to occur in the free magnetic layer of the MTJ. To read the data bits, the TFTs 89 are turned on. With a smaller bias voltage between the source line 70 and the bit line 104 than in the write operation, a current flows through the top electrode 84 and the bottom electrode 70 of each TFT 89. The total current that flows through all TFT 89s that are electrically connected to a MTJ is determined by the resistance of the MTJ. This current is used to determine whether a zero or a one is stored in the MTJ of the memory element 100.

In alternate embodiments of the present disclosure, each memory cell may comprise more than two vertical TFTs 89 that are electrically connected to each MRAM memory element 100 of a memory device. This plurality of TFTs 89 may be connected to each other in parallel and may provide a larger drive current to the memory element 100 than a single TFT 89. In addition, the TFTs 89 tare connected to each other in in parallel which allows for decreased resistance while increasing available drive current. In this way the drive current available can be customized by using a plurality of vertical TFTs in different configurations. This also allows for the ability to provide a drive current for different types of alternative memory technologies such as for example, PCRAM, RRAM, or the like.

Figure 22:
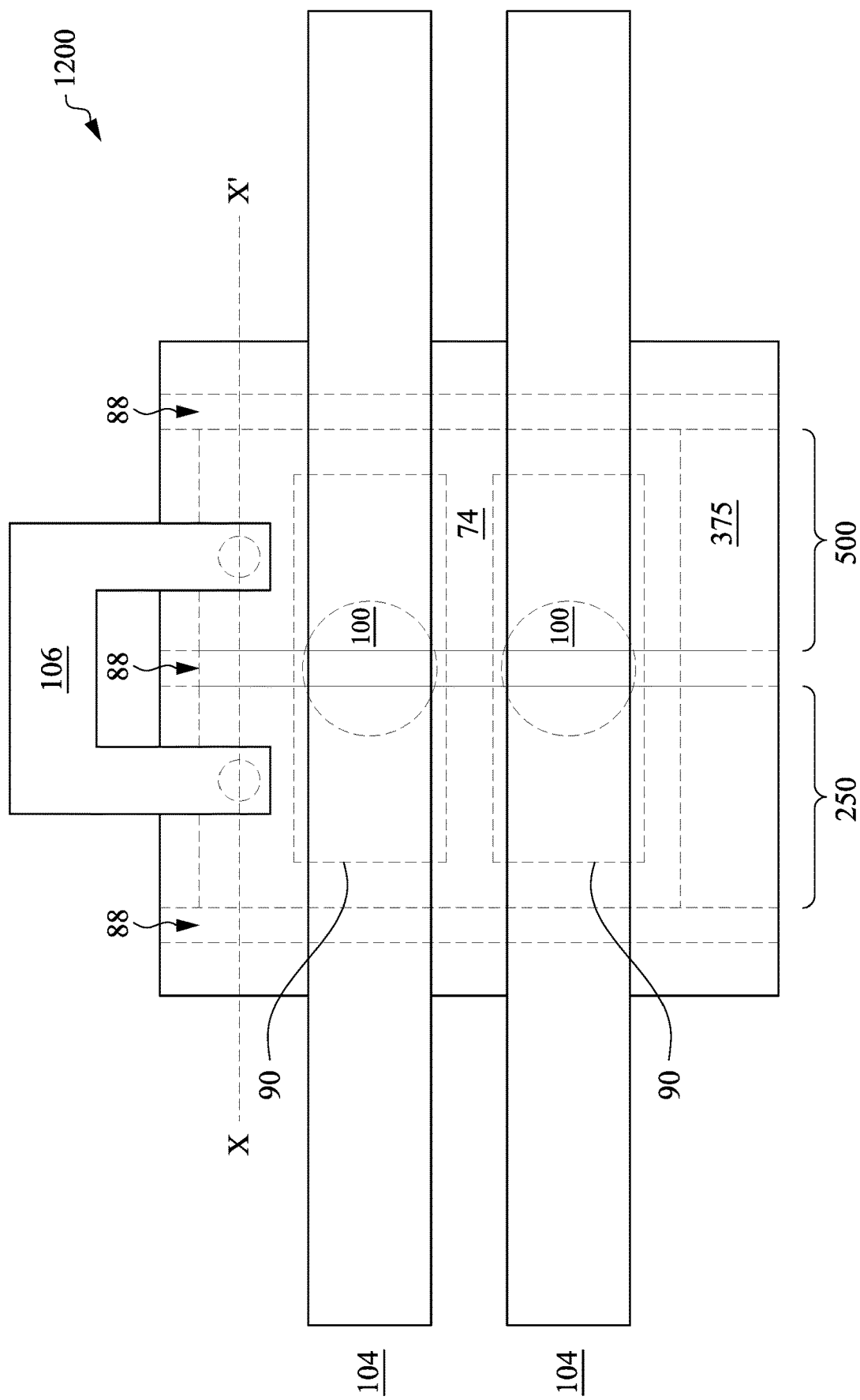

FIG. 22 illustrates a top-view of the semiconductor device 1200 after the formation of a word line contact 106. In FIG. 22, the location of the isolation structures 88, the metal gate 74, the conductive features 90, and the memory elements 100 is shown in ghost. Each memory cell of the semiconductor device 1200 has a memory element 100 that is electrically connected to two vertical TFTs 89 that provide the drive current for the memory element 100. Each memory element 100 is coupled to a bit line 104. The metal gate 74 in the first region 250 and the metal gate 74 in the second region 500 are electrically isolated from each other by the isolation structure 88, but are electrically connected to the same reference voltage, positive supply voltage, or the like by the word line contact 106.

Figure 23:
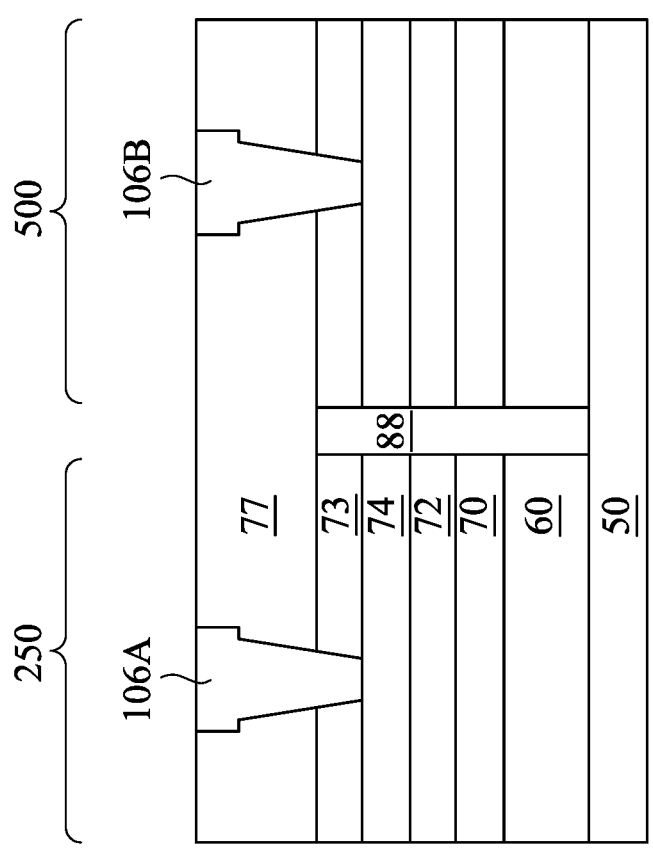

FIG. 23 illustrates a cross-sectional view along line X-X' of FIG. 22. FIG. 23 shows a first portion 106A and a second portion 106B of the word line contact 106 extending through the second ILD 77 and the dielectric layer 73 to directly contact top surfaces of the metal gate 74 in both the first region 250 and the second region 500. The metal gate 74 in the first region 250 and the metal gate 74 in the second region 500 are electrically isolated from each other by isolation structure 88, but are electrically connected to the same reference voltage, positive supply voltage, or the like by the first portion 106A and the second portion 106B of the word line contact 106.

The first portion 106A and the second portion 106B of the word line contact 106 are formed through the second ILD 77 and the dielectric layer 73 in accordance with some embodiments. Two openings for the first portion 106A and the second portion 106B of the word line contact 106 are formed through the second ILD 77 and the dielectric layer 73 directly above the metal gate 74 in the first region 250 and the second region 500. The openings may be formed using acceptable photolithography and etching techniques. A conductive material is then formed in the opening that may comprise Cu, Al, Ti, Ta, W, Pt, Ni, Cr, Ru, TiN, TaN, combinations thereof, multilayers thereof, or the like. A planarization process, such as a CMP, may be performed to remove excess conductive material from a surface of the second ILD 77. The remaining conductive material forms the word line contact 106 in the openings. The first portion 106A of the word line contact 106 electrically connects the metal gate 74 in the first region 250 to a reference voltage, positive supply voltage, or the like. The second portion 106B of the word line contact 106 electrically connects the metal gate 74 in the second region 500 to the same reference voltage, positive supply voltage, or the like.

Figure 24A:
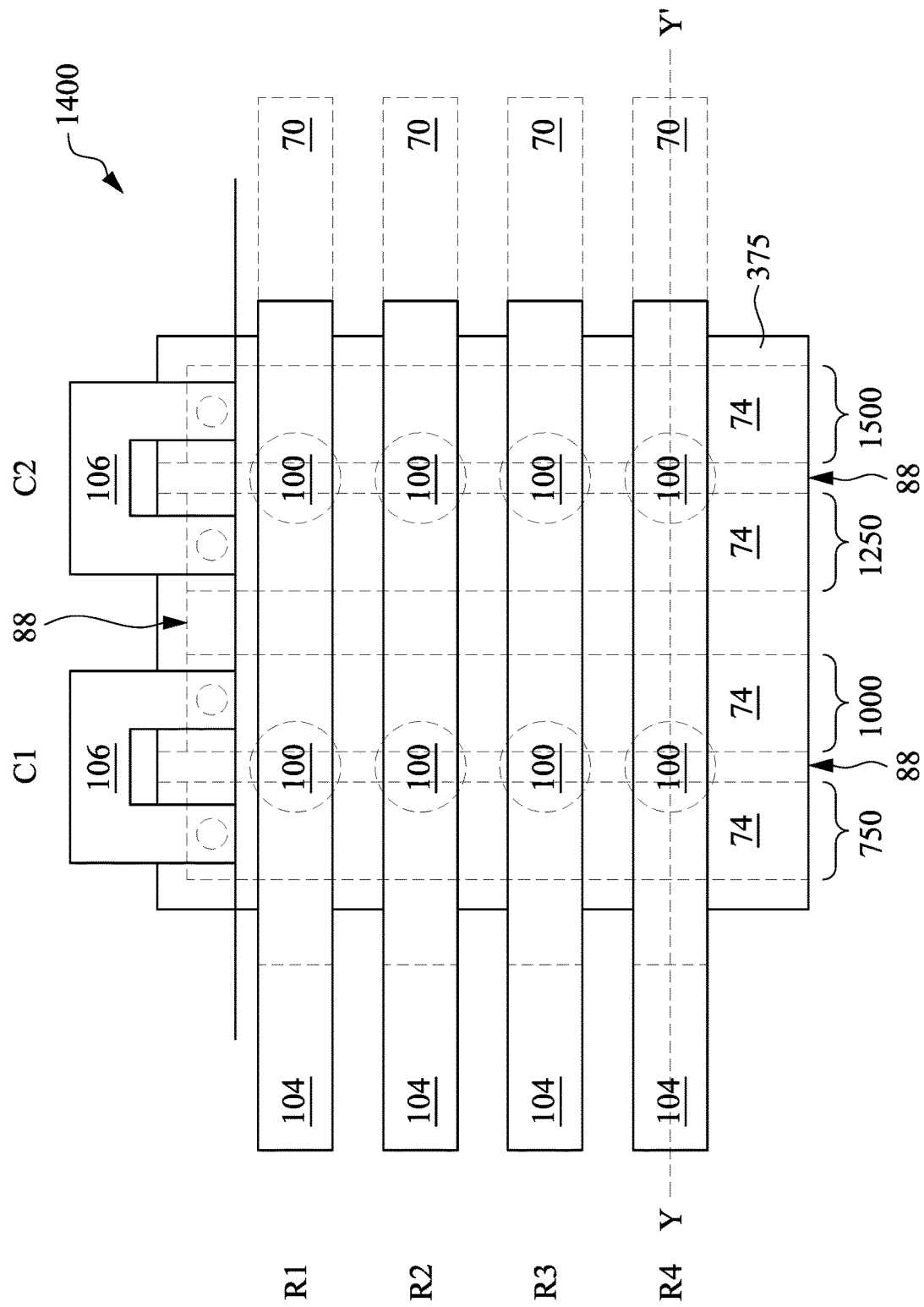
FIG. 24A illustrates a top-view of a semiconductor device, in accordance with an embodiment.

FIG. 24A illustrates a top-view of a semiconductor device 1400 in accordance with an example embodiment of the present disclosure. The semiconductor device 1400 may be similar to the semiconductor device 1200 of FIGS. 1 through 23 where like reference numerals indicate like elements formed using like processes. The semiconductor device 1400 includes a memory array arranged in rows (R1, R2, R3 and R4) and columns (C1 and C2). Although four rows and two columns are illustrated in FIG. 24A, any number of rows and columns can be formed. In FIG. 24A, the location of the metal gates 74, the bottom electrodes 70, the isolation structures 88, and the memory elements 100 is shown in ghost. Each column comprises a number of memory cells. Each memory element 100 is electrically connected to two vertical TFTs 89 that provide a drive current for the memory element 100. The two vertical TFTs 89 are connected to each other in parallel. Memory elements 100 of memory cells that are in the same row and in adjacent columns share a same bit line 104, in the form of a strip. TFTs 89 of memory cells that are in the same row are electrically connected to the same bottom electrode 70, in the form of a strip. The metal gate 74 in the first region 750 and the second region 1000 of the column C1 functions as a word line and is coupled to a first reference voltage, positive supply voltage, or the like, and the metal gate 74 in the third region 1250 and the fourth region 1500 of the column C2 function as a word line and is coupled to a second reference voltage, positive supply voltage, or the like. The metal gate 74 in the first region 750 and the metal gate 74 in the second region 1000 are electrically isolated from each other by the isolation structure 88, but are electrically connected to the first reference voltage, positive supply voltage, or the like by a first word line contact 106. The metal gate 74 in the third region 1250 and the metal gate 74 in fourth region 1250 are electrically isolated from each other by the isolation structure 88, but are electrically connected to the second reference voltage, positive supply voltage, or the like by a second word line contact 106.

Figure 24B:
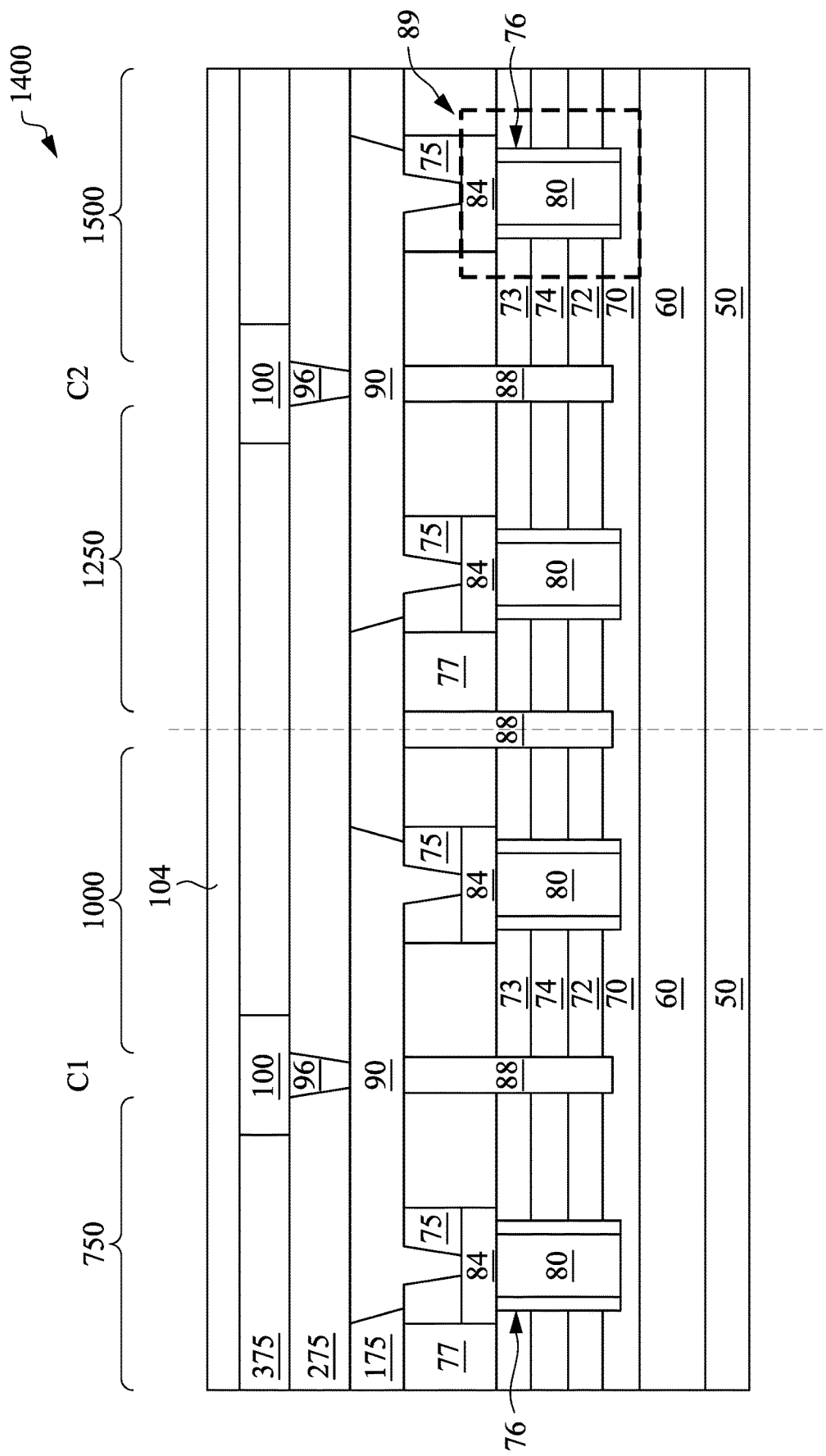
FIG. 24B illustrates a cross-sectional view of the semiconductor device illustrated in FIG. 24A, in accordance with an embodiment.

FIG. 24B illustrates a cross-sectional view along line Y-Y' of FIG. 24A and shows the first region 750 and the second region 1000 of the column C1 and the third region 1250 and the fourth region 1500 of the column C2 of the semiconductor device 1400. Isolation structures 88 electrically isolate the metal gate 74 in the first region 750 and the second region 1000 in the column C1 from each other, and the isolation structures 88 further electrically isolate the metal gate 74 in the third region 1250 and the fourth region 1500 in the column C2 from each other. In addition, an isolation structure 88 also electrically isolates the metal gate 74 in the second region 1000 of the column C1 from the metal gate 74 in the third region 1250 of the column C2. Memory elements 100 in the same row and in adjacent columns C1 and C2 are coupled to the same bit line 104. The vertical TFTs 89 that are coupled to memory elements 100 in the same row and in adjacent columns C1 and C2 are electrically connected to the same bottom electrode 70. Two TFTs 89 in each of the columns C1 and C2 are electrically connected to each other by the conductive feature 90 and provide the drive current for each memory element 100. The metal gate 74 in the first region 750 and the second region 1000 of the column C1 is electrically connected to a first reference voltage, positive supply voltage, or the like and the metal gate 74 in the third region 1250 and the fourth region 1500 of the column C2 is electrically connected to a second reference voltage, positive supply voltage, or the like.

Figure 24C:
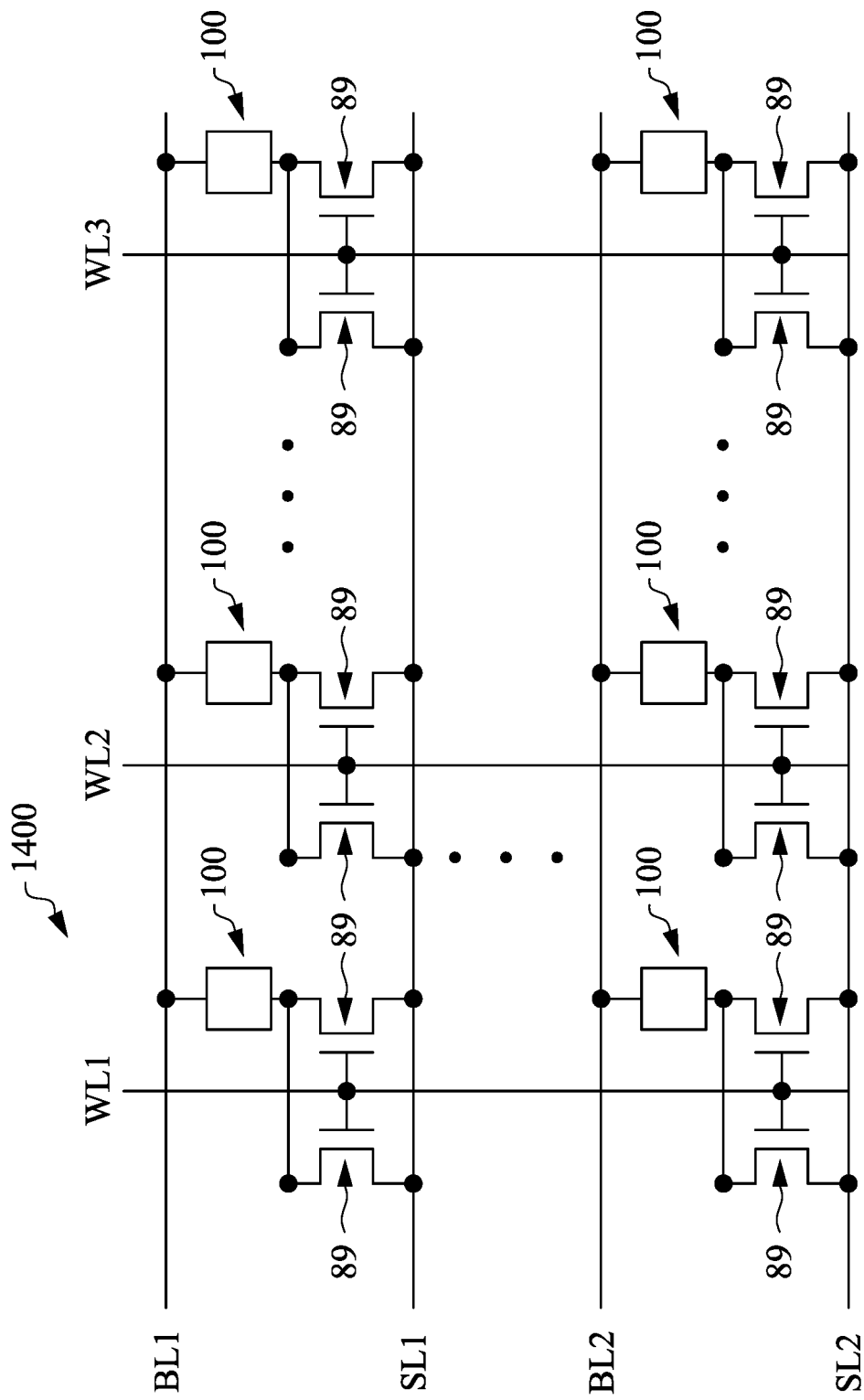
FIG. 24C illustrates a schematic view of the semiconductor device illustrated in FIGS. 24A through 24B, in accordance with an embodiment.

FIG. 24C illustrates a schematic view showing an equivalent circuit of the semiconductor device 1400. The semiconductor device 1400 is a memory array that includes a plurality of memory cells. Each memory cell comprises a memory element 100. One skilled in the art will readily appreciate that the memory array may include more memory elements 100 than illustrated in FIGS. 24A through 24B to store a pre-determined amount of data bits and any number of rows and columns can be formed to meet the requirements of alternative embodiments. As illustrated in FIG. 24C, the memory array includes memory elements 100 organized in an array (e.g., in rows and columns), and has bit lines (e.g., BL1, BL2), word lines (e.g., WL1, WL2, WL3), and source lines (e.g., SL1, SL2). Each of the memory elements 100 is coupled between a bit line and top electrodes 84 (drains) of two corresponding TFTs 89. The two TFTs 89 are connected in parallel to each other. A metal gate 74 of the two corresponding TFTs 89 functions as a word line, and a bottom electrode 70 (source) of the corresponding TFTs 89 functions as a source line. The total current that flows through the two corresponding TFT 89s that are electrically connected to a memory element 100 is determined by the resistance of the memory element 100. This current is used to determine whether a zero or a one is stored in the memory element 100, and write the memory element 100 when the voltage between the source line and the bit line is large.

Figure 25A:
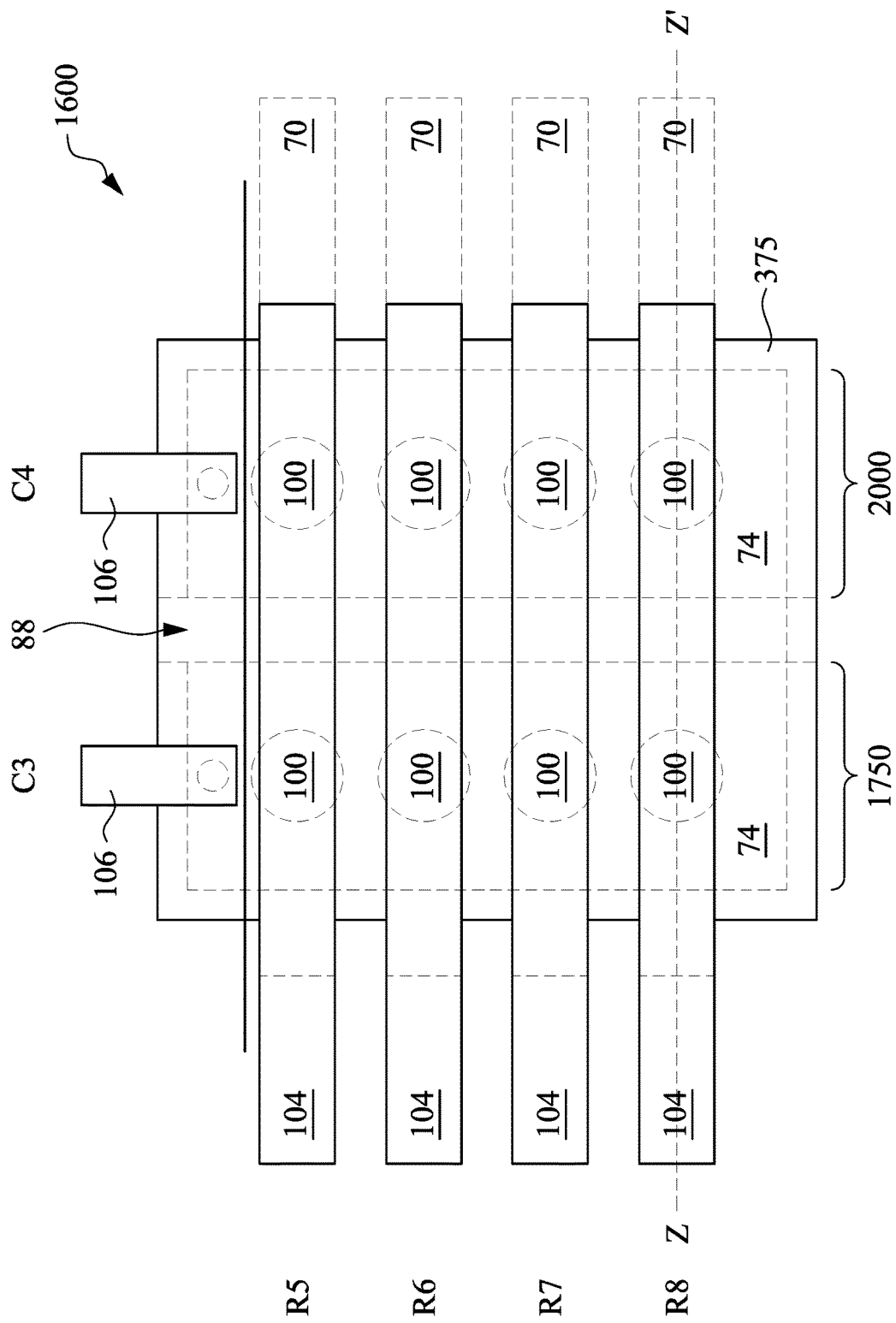
FIG. 25A illustrates a top-view of a semiconductor device, in accordance with an embodiment.

FIG. 25A illustrates a top-view of a semiconductor device 1600 in accordance with an example embodiment of the present disclosure. The semiconductor device 1600 may be similar to the semiconductor device 1400 of FIGS. 24A through 24C where like reference numerals indicate like elements formed using like processes. The semiconductor device 1600 includes a memory array arranged in rows (R5, R6, R7 and R8) and columns (C3 and C4). In FIG. 25A, the location of the metal gates 74, the bottom electrodes 70, the isolation structure 88, and the memory elements 100 is shown in ghost. Although four rows and two columns are illustrated in FIG. 25A, any number of rows and columns can be formed. Each column comprises a number of memory cells. Each memory element 100 is electrically connected to two vertical TFTs 89 that provide a drive current for the memory element 100. The two vertical TFTs 89 that provide the drive current for the memory element 100 are connected to each other in parallel and share a common metal gate 74. Memory elements 100 of memory cells that are in the same row and in adjacent columns C3 and C4 are coupled to the same bit line 104, in the form of a strip. TFTs 89 of memory cells that are in the same row and in adjacent columns C3 and C4 are electrically connected to the same bottom electrode 70, in the form of a strip. Each bottom electrode 70 functions as a source line. The metal gate 74 of the column C3 in the first region 1750 is electrically isolated from the metal gate 74 of the column C4 in the second region 2000 by an isolation structure 88. The metal gate 74 in the first region 1750 of the column C1 functions as a word line and is coupled to a first reference voltage, positive supply voltage, or the like by a first word line contact 106, and the metal gate 74 in the second region 2000 of the column C4 functions as a word line and is coupled to a second reference voltage, positive supply voltage, or the like by a second word line contact 106.

In some embodiments, because the two vertical TFTs 89 that provide the drive current for the memory element 100 of each memory cell share a common metal gate 74, this simplifies a forming process for forming a word line contact 106 that electrically connects the metal gate 74 to a reference voltage, positive supply voltage, or the like. A single opening for the word line contact 106 may be formed through the second ILD 77 and the dielectric layer 73 directly above the metal gate 74 in each of the first region 1750 and the second region 2000. The opening may be formed using acceptable photolithography and etching techniques. A conductive material is then formed in the opening that may comprise Cu, Al, Ti, Ta, W, Pt, Ni, Cr, Ru, TiN, TaN, combinations thereof, multilayers thereof, or the like. When two vertical TFTs 89 that provide the drive current for the memory element 100 of each memory cell do not share a common metal gate 74 (as described previously in the embodiment of FIGS. 22 through 23) two openings are required during the forming of the word line contact 106 to electrically connect the portion of the metal gate 74 corresponding to each TFT 89 to the same reference voltage, positive supply voltage, or the like.

Figure 25B:
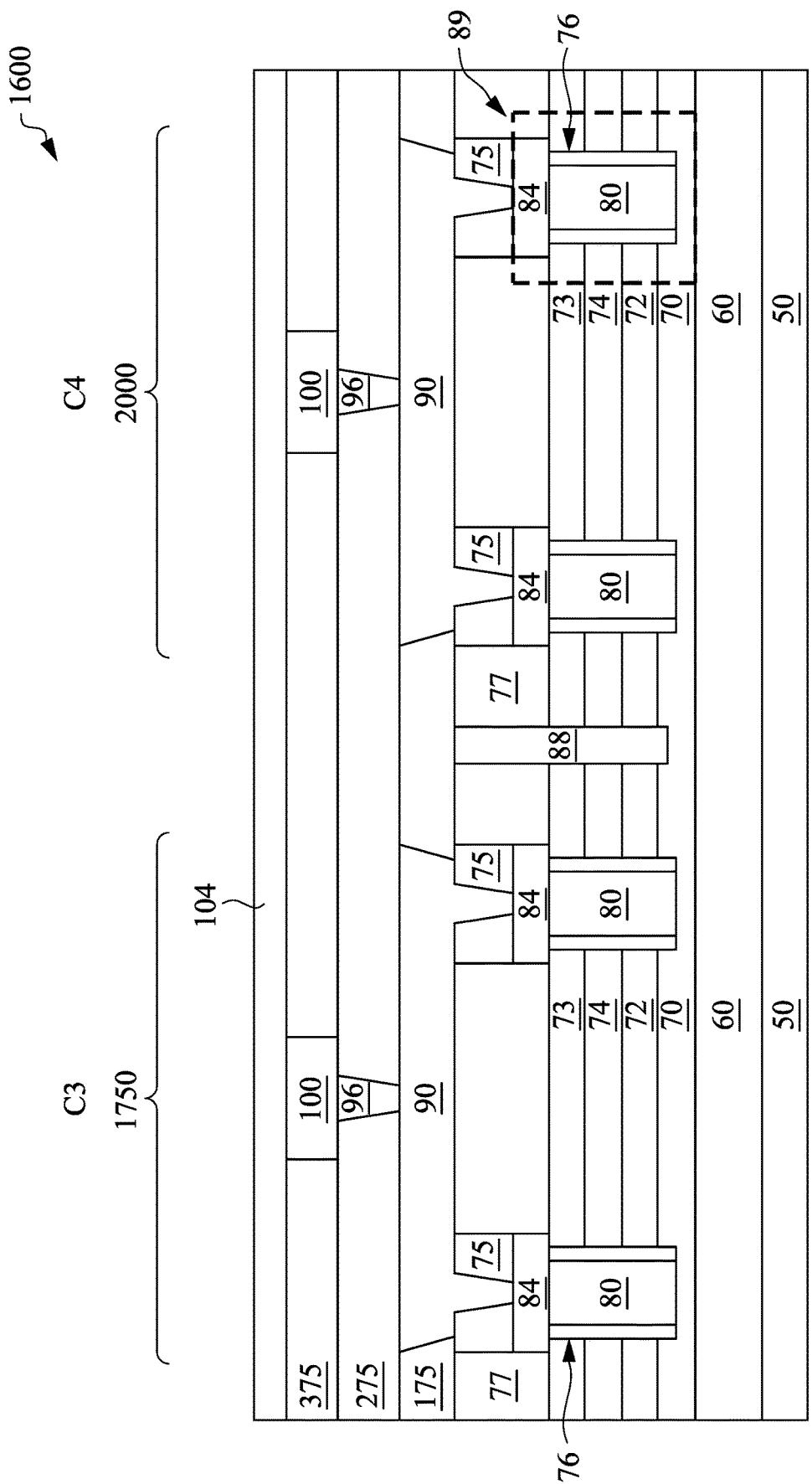
FIG. 25B illustrates a cross-sectional view of the semiconductor device illustrated in FIG. 25A, in accordance with an embodiment.

FIG. 25B is illustrates a cross-sectional view of a line Z-Z' in FIG. 25A and shows the first region 1750 of the column C3 and the second region 2000 of the column C4 of the semiconductor device 1600. The isolation structure 88 electrically isolates the metal gate 74 in the first region 1750 of the column C3 from the metal gate 74 in the second region 2000 of the column C4. Memory elements 100 that are in the same row and in adjacent columns C3 and C4 are coupled to the same bit line 104. TFTs 89 coupled to memory elements 100 that are in the same row and in adjacent columns C3 and C4 are electrically connected to the same bottom electrode 70, which functions as a source line. Two TFTs 89 in each of the columns C3 and C4 are electrically connected to each other by the conductive feature 90 and provide the drive current for each memory element 100. The two TFTs 89 that provide the drive current for each memory element 100 also share the common metal gate 74 in either the first region 1750 or the second region 2000. The metal gate 74 in the first region 1750 of the column C3 is electrically connected to a first reference voltage, positive supply voltage, or the like and the metal gate 74 in the second region 2000 of the Column C4 is electrically connected to a second reference voltage, positive supply voltage, or the like.

Figure 26:
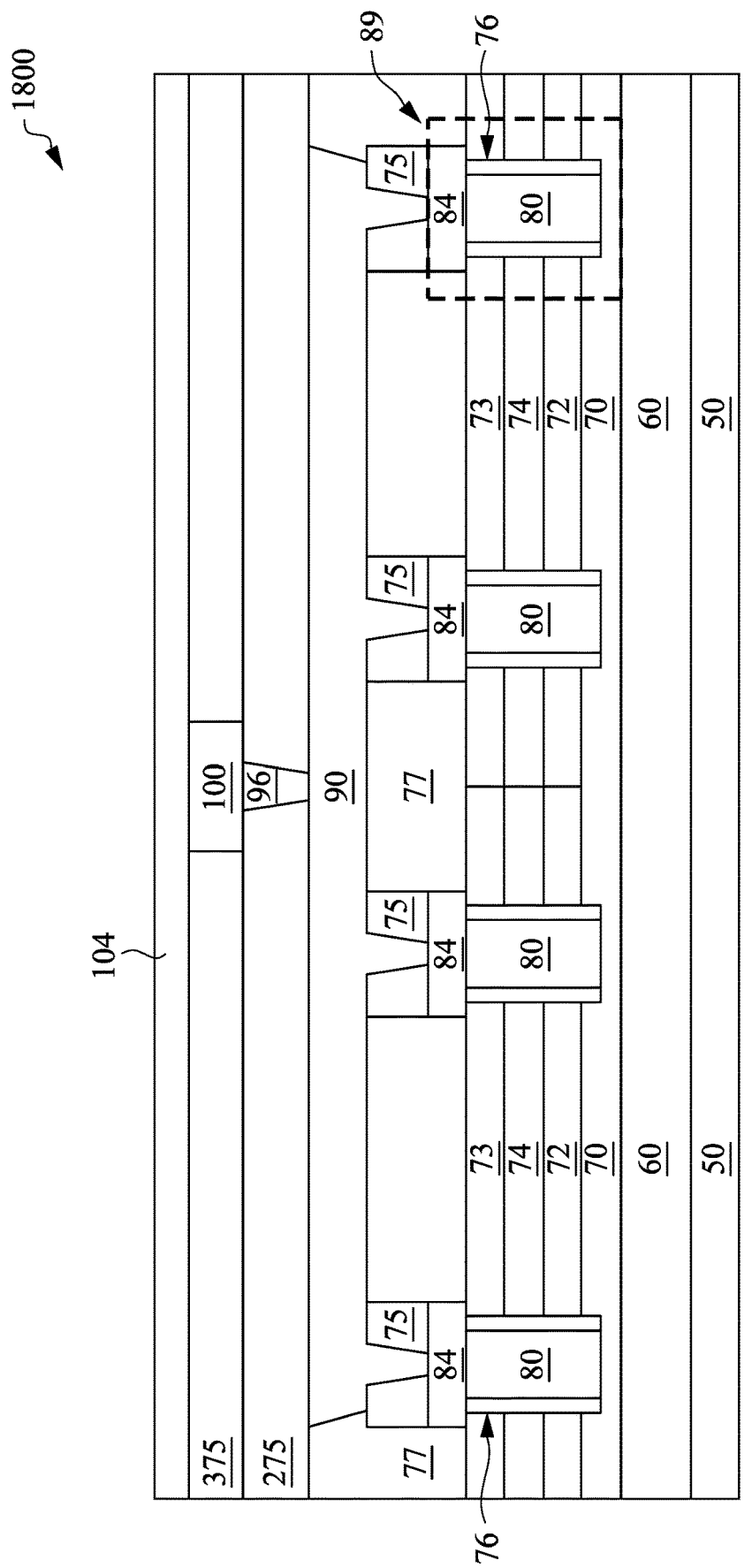
FIG. 26 illustrates a cross-sectional view of a semiconductor device, in accordance with an embodiment.

FIG. 26 illustrates a cross-sectional view of a semiconductor device 1800 in accordance with an example embodiment of the present disclosure. The semiconductor device 1800 may be similar to the semiconductor device 1400 of FIGS. 24A through 24C where like reference numerals indicate like elements formed using like processes. The semiconductor device 1800 may comprise a memory array that includes a memory cell that has four vertical TFTs 89 that provide a drive current for the memory element 100. Although four vertical TFTs 89 that are connected in parallel are illustrated in FIG. 26, any number of TFTs 89 can be formed. The use of a plurality of TFTs 89 may provide a larger drive current to the memory element 100 than a single TFT 89. In addition, TFTs 89 that are connected in parallel will result in decreased resistance which allows for an increase in drive current available. In this way the drive current available can be customized by using a plurality of vertical TFTs in different configurations. This also allows for the ability to provide a drive current for different types of alternative memory technologies such as for example, PCRAM, RRAM, or the like.

The memory element 100 is electrically connected by the conductive feature 90 to four vertical TFTs 89 that provide a drive current for the memory element 100. All TFTs 89 that provide the drive current to the memory element 100 are electrically connected to the same bottom electrode 70, in the form of a strip. All TFTs 89 that provide the drive current to the memory element 100 are also electrically connected to a single bit line 104. The bottom electrode 70 functions as a source line. The four vertical TFTs 89 share a common metal gate 74 which functions as a word line and is electrically connected to a reference voltage, positive supply voltage, or the like by a word line contact 106. Since only a single word line is formed, this may allow for a reduction in the word line density which frees up space in the BEOL (e.g., in the interconnect layers) that can be utilized for another purpose. For example, a word line density of the semiconductor device 1800 may be 25 percent of a word line density of the semiconductor device 1400 (described previously in FIGS. 24A through 24C). In some embodiments, because the four vertical TFTs 89 that provide the drive current for the memory element 100 of the memory cell share a common metal gate 74, this simplifies a forming process for forming a word line contact 106 that electrically connects the metal gate 74 to reference voltage, positive supply voltage, or the like. A single opening for the word line contact 106 may be formed through the second ILD 77 and the dielectric layer 73 directly above the common metal gate 74. The opening may be formed using acceptable photolithography and etching techniques. A conductive material is then formed in the opening that may comprise Cu, Al, Ti, Ta, W, Pt, Ni, Cr, Ru, TiN, TaN, combinations thereof, multilayers thereof, or the like.

Figure 27B:
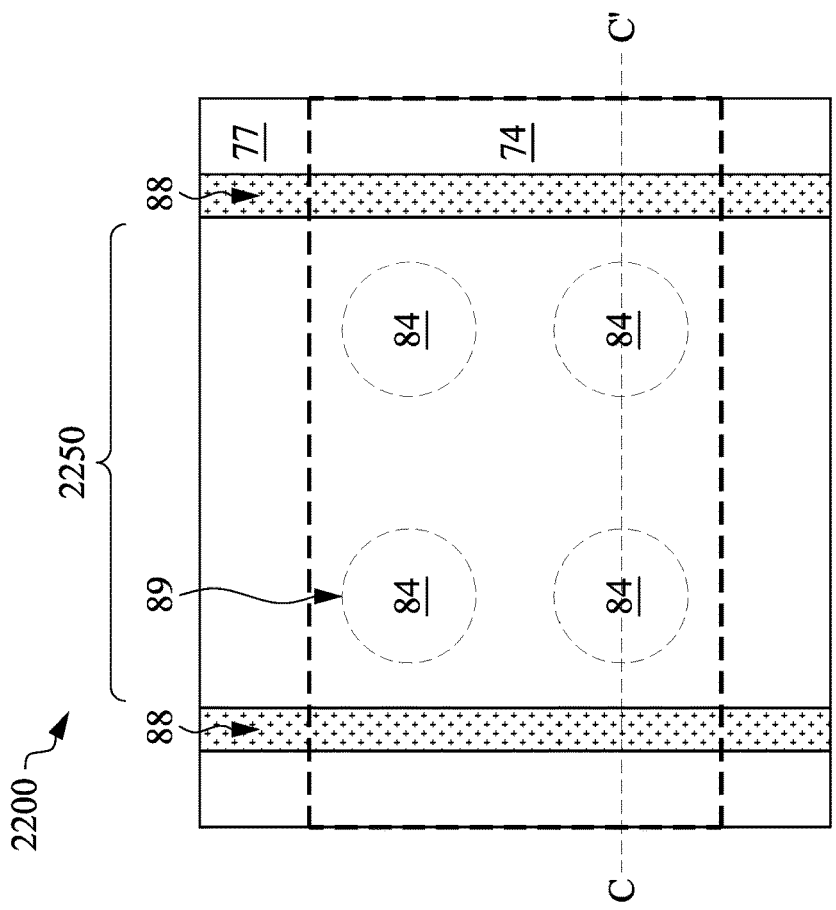
FIGS. 27A through 27D are various views of intermediate stages in the manufacturing of a semiconductor device, in accordance with some embodiments.
Figure 27A:
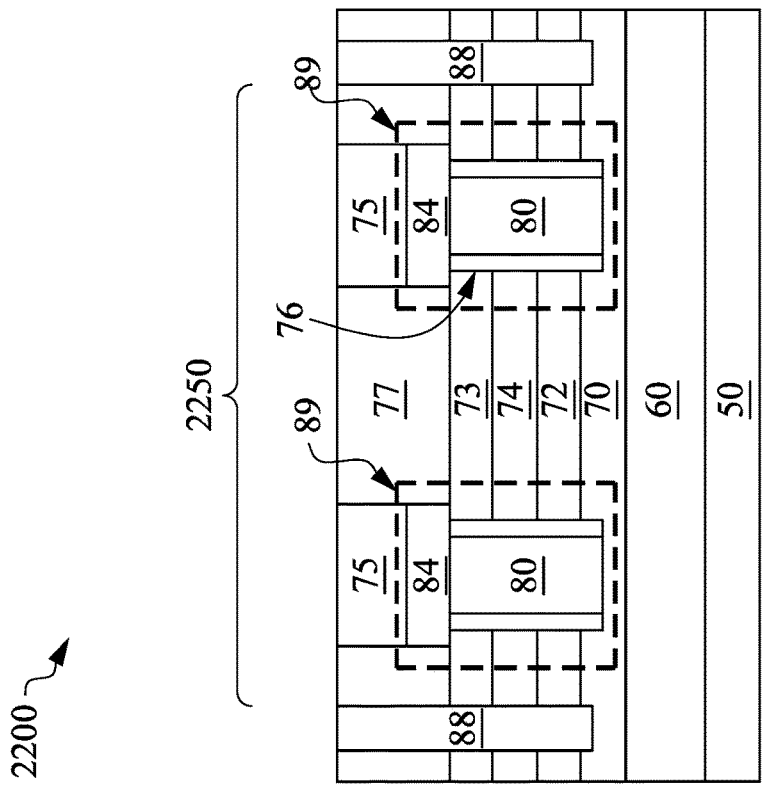

FIG. 27A illustrates a cross-sectional view of a semiconductor device 2200 taken along the line C-C' of FIG. 27B. The semiconductor device 2200 includes a memory cell that comprises a MTJ coupled to a plurality of vertical TFTs formed in a Back End of Line (BEOL) of a fabrication process. The semiconductor device 2200 and the semiconductor device 1200 may be similar to the features discussed above with respect to FIG. 12 where like features are formed using like processes. Further description of these features is omitted for brevity.

In FIG. 27A the formation of isolation structures 88 is shown in accordance with some embodiments. In accordance with some embodiments of the present disclosure, the second ILD 77, the dielectric layer 73, the metal gate 74 and the dielectric layer 72 are etched to form trenches. In some embodiments, the trenches may extend to an intermediate level of the bottom electrodes 70. The trenches may be formed by using acceptable photolithography and etching techniques, for example. The trenches may then be filled with a dielectric material which may be silicon nitride, silicon oxide, silicon oxynitride, or the like, and may be formed by an ALD, CVD, or the like process. Subsequently, a planarization process, such as a CMP, may be performed to remove excess dielectric material from a surface of the second ILD 77, thus defining the isolation structures 88. The isolation structures 88 extend along a lengthwise direction, which is perpendicular to the lengthwise direction of the metal gate 74. The isolation structures 88 extend through the metal gate 74 and electrically isolate a portion of the metal gate 74 in a first region 2250 of the semiconductor device 2200 that is bound by the isolation structures 88.

FIG. 27B illustrates a top-view of the semiconductor device 2200 after the formation of the isolation structures 88. In FIG. 27B, the location of the metal gate 74 and the TFTs 89 is shown in ghost. Four TFTs 89 in the first region 2250 that are bound between the isolation structures 88 share a common metal gate 74, which functions as a word line. Although four vertical TFTs 89 are illustrated in FIG. 27B, any number of TFTs 89 can be formed to meet the drive requirements of alternative embodiments.

Figure 27D:
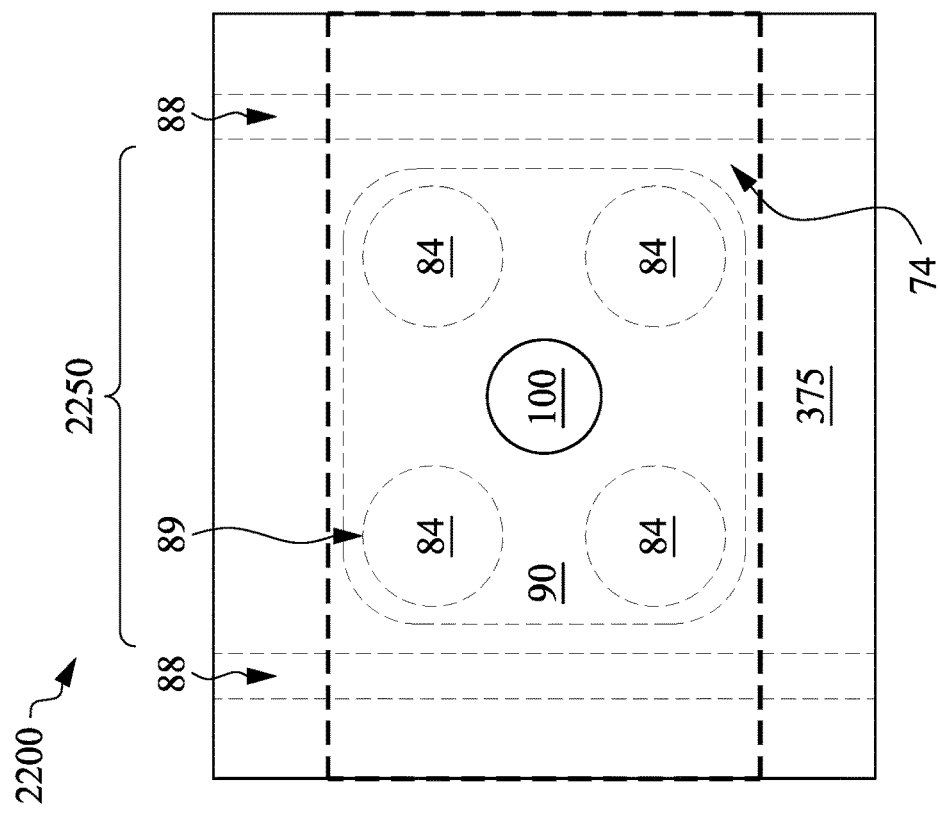
Figure 27C:
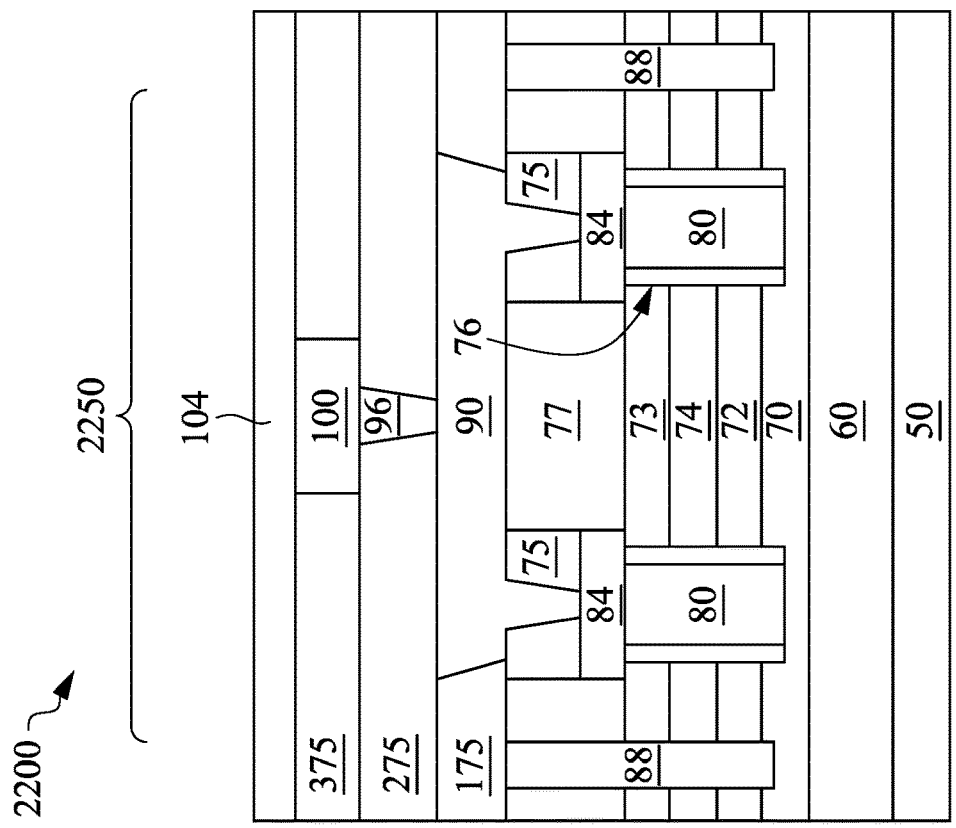

FIG. 27C illustrates the formation of a third ILD 175 deposited over the structure illustrated in FIGS. 27A through 27B. The third ILD 175 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The third ILD 175 may be formed of the same material as the first ILD 75 and the second ILD 77.

Next, an opening is formed through the third ILD 175 and first ILD 75. The opening extends to and exposes the top electrodes 84 of four TFTs 89 in the first region 2250. The opening may be formed by acceptable photolithography and etching techniques, such as a dual damascene patterning process. The opening in the third ILD 175 spans across the first region 2250, and the opening in the first ILD 75 include separate via openings that each extend to the top electrodes 84 in the first region 2250.

A conductive feature 90 is then formed in the opening, for example, in a dual damascene process. The conductive feature 90 may be formed using CVD, physical vapor deposition (PVD), electro-chemical plating (ECP), electro-less plating, or the like and may be formed of conductive materials such as Cu, Al, Ti, Ta, W, Pt, Ni, Cr, Ru, TiN, TaN, combinations thereof, multilayers thereof, or the like. Excess portions of the conductive feature 90 above the opening may be removed by using a planarization process such as a CMP, or the like. The planarization process may remove excess conductive feature 90 from above a top surface of the third ILD 175. Hence, top surfaces of the conductive feature 90 and the third ILD 175 may be substantially level (e.g., within manufacturing tolerances). The conductive feature 90 may be referred to as a contact, conductive line, conductive pad, via, etc. The conductive feature 90 electrically connects four TFTs 89 in the first region 2250 of the semiconductor device 2200.

A fourth ILD 275 is then deposited over the conductive feature 90 and the third ILD 175. The fourth ILD 275 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The fourth ILD 275 may be formed of the same material as the first ILD 75, the second ILD 77 and the third ILD 175.

Next, contact via 96 is formed through the fourth ILD 275 in accordance with some embodiments. An opening for the contact via 96 is formed through the fourth ILD 275 to expose the conductive feature 90. The opening may be formed using acceptable photolithography and etching techniques. A conductive material is formed in the opening that may comprise titanium nitride, tungsten, tantalum nitride, or the like. A planarization process, such as a CMP, may be performed to remove excess conductive material from a surface of the fourth ILD 275. The remaining conductive material forms the contact via 96 in the opening.

A memory stack is then formed over the fourth ILD 275 and the contact via 96. The memory stack may comprise an MRAM magnetic tunnel junction (MTJ) stack, which may include a pinned magnetic layer, a free magnetic layer, and a tunneling non-magnetic barrier layer between the pinned magnetic layer and the free magnetic layer. Each of the pinned magnetic layer and the free magnetic layer comprises a suitable magnetic material(s), such as cobalt iron boron (CoFeB), cobalt iron (CoFe), nickel iron (NiFe), a synthetic magnetic material comprising Co/Ru or Ir/Co, or the like. In an embodiment, the tunneling non-magnetic barrier layer comprises magnesium oxide (MgO). Each of layers may be formed by way of deposition processes such as CVD, PVD, atomic layer deposition (ALD), or the like.

Next, a mask layer may be deposited over the memory stack. The mask layer may be a hard mask layer, comprising for example, silicon nitride, silicon oxynitride, or the like. The mask layer may be patterned according to a subsequently formed photoresist layer over the mask layer that may be patterned using lithographic methods.

FIG. 27C also illustrates the formation of the memory element 100 by using the patterned mask layer as an etching mask to etch the memory stack. The pattern of the mask layer is transferred to the memory stack. After the etching, the memory element 100 remains over top surfaces of the fourth ILD 275 and the contact via 96. The remaining mask layer can then be removed by a suitable method (e.g., ashing). The memory element 100 is electrically connected to the four vertical TFTs 89 in the first region 2250 through the contact via 96 and the conductive feature 90. The four vertical TFTs 89 are connected to each other in parallel. Although the memory element 100 is described as an MTJ interconnected to a plurality of vertical TFTs 89 that act as access transistors to the MTJ, alternate embodiments of the present disclosure allow for the interconnection of CMOS to other types of memory technologies (e.g., PCRAM, RRAM or the like).

Next, a fifth ILD 375 is deposited over the semiconductor device 2200. The fifth ILD 375 surrounds the memory element 100. The fifth ILD 375 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The fifth ILD 375 may be formed of the same material as the first ILD 75, the second ILD 77, and third ILD 175, and the fourth ILD 275. The fifth ILD 375 may subsequently have its thickness reduced by use of a planarization process, such as a CMP for example.

A bit line 104 is then formed in the fifth ILD 375, in accordance with some embodiments. Although the bit line 104 is illustrated as being over the fifth ILD 375, the bit line 104 and the fifth ILD 375 may have top surfaces that are substantially level (e.g., within manufacturing tolerances). The bit line 104 may comprise a conductive strip. More than one bit line 104 may be formed, in accordance with embodiments. Trenches may be formed in the fifth ILD 375. The trenches may be formed using acceptable photolithography and etching techniques. The trenches may then be filled with a conductive material using CVD, physical vapor deposition (PVD), electro-chemical plating (ECP), electroless plating, or the like. The conductive material may comprise a material such as Cu, Al, Ti, Ta, W, Pt, Ni, Cr, Ru, TiN, TaN, combinations thereof, multilayers thereof, or the like. Any excess conductive material may be removed by, for example, a planarization process such as a chemical mechanical polish (CMP) process. The bit line 104 extends along a lengthwise direction, which is parallel to the lengthwise direction of the metal gate 74. The bit line 104 is coupled to the memory element 100 of the semiconductor device 2200.

FIG. 27D illustrates a top-view of the semiconductor device 2200 after the formation of the memory element 100 and prior to the formation of the bit line 104. In FIG. 27D, the location of the metal gate 74, TFTs 89, the conductive feature 90, and the isolation structures 88 is shown in ghost. The semiconductor device 2200 comprises a memory cell that includes the memory element 100. The four vertical TFTs 89 are shown arranged in a rectangular array in a 2 rows and 2 columns (2×2) configuration and provide a drive current for the memory element 100. In alternate embodiments, any number of TFTs 89 can be formed in any configuration. The four TFTs 89 in the first region 2250 are bound between the isolation structures 88 and share the common metal gate 74 which functions as a word line.

Figure 28:
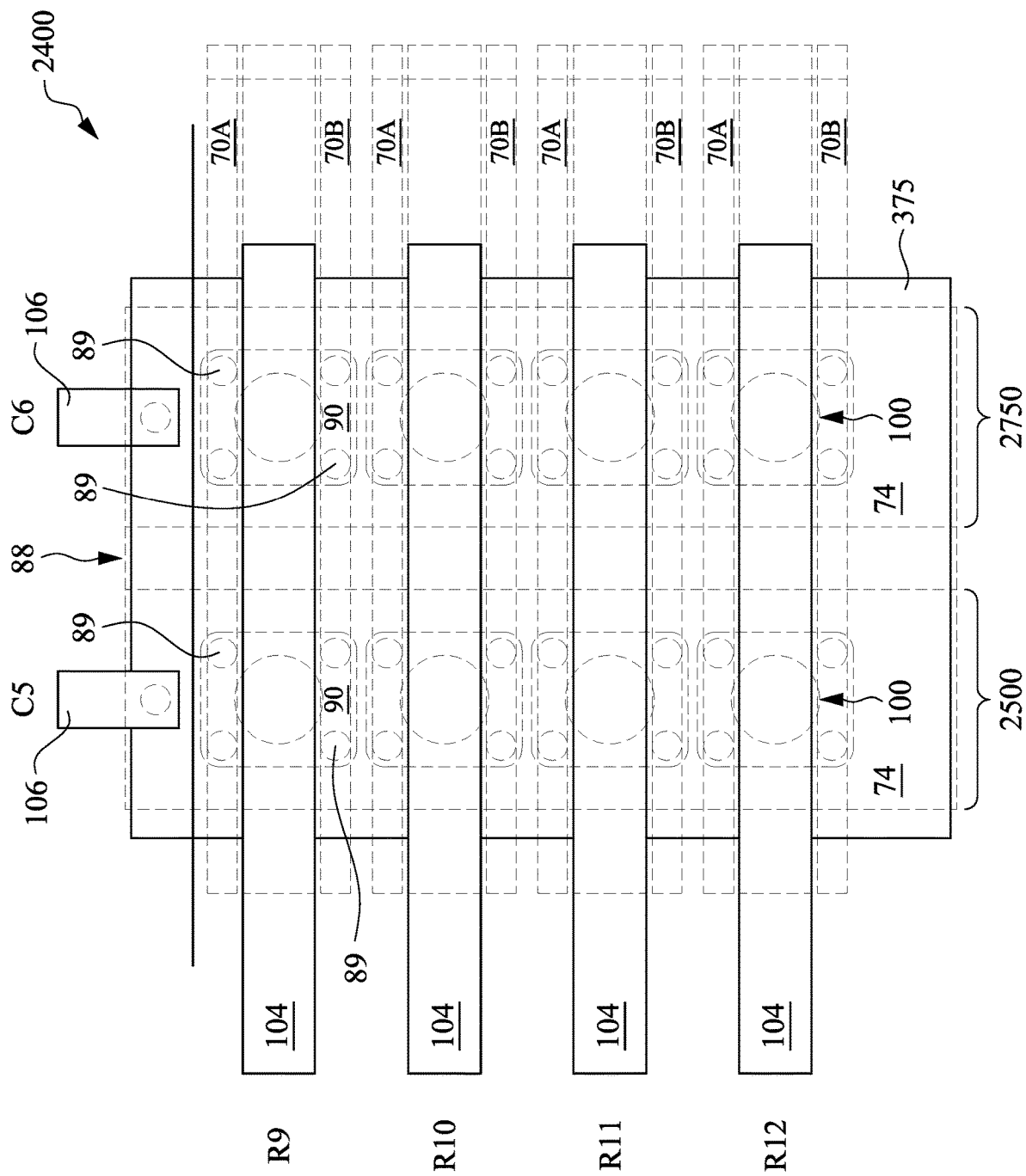
FIG. 28 illustrates a top-view of a semiconductor device, in accordance with an embodiment.

FIG. 28 illustrates a top-view of a semiconductor device 2400 in accordance with an example embodiment of the present disclosure. The semiconductor device 2400 may be similar to the semiconductor device 2200 of FIGS. 27A through 27D where like reference numerals indicate like elements formed using like processes. The semiconductor device 2400 includes a memory array arranged in rows (R9, R10, R11, and R12) and columns (C5 and C6). Although four rows and two columns are illustrated in FIG. 28, any number of rows and columns can be formed. Each column comprises a number of memory cells. In FIG. 28, the location of the metal gates 74, TFTs 89, the conductive features 90, first bottom electrodes 70A, second bottom electrodes 70B, the isolation structure 88, and the memory elements 100 is shown in ghost. Each memory element 100 is electrically connected to four vertical TFTs 89 arranged in a rectangular array in a 2 rows and 2 columns (2×2) configuration that provide a drive current for the memory element 100 in a similar manner as that of the semiconductor device 2200 that was described previously in FIGS. 27A through 27D. The four vertical TFTs 89 are connected to each other in parallel. In alternative embodiments, any number of vertical TFTs 89 arranged in different configurations can be used to provide a drive current for the memory element 100.

All vertical TFTs 89 in the column C5 that provide the drive current for memory elements 100 in the column C5 share a common metal gate 74 which functions as a word line. All vertical TFTs 89 in the column C6 that provide the drive current for memory elements 100 in the column C6 share a common metal gate 74 which functions as a word line. Memory elements 100 that are in the same row and in adjacent columns C5 and C6 are coupled to the same bit line 104. Two top TFTs 89 of every memory cell coupled to memory elements 100 in the same row and in adjacent columns C5 and C6 are electrically connected to a first bottom electrode 70A, in the form of a strip, and two lower TFTs 89 of every memory cell coupled to memory elements 100 in the same row and in adjacent columns C5 and C6 are electrically connected to a second bottom electrode 70B, in the form of a strip. The first bottom electrode 70A and the second bottom electrode 70B of the memory elements in the same row and in adjacent columns C5 and C6 function as source lines and are electrically connected to the same reference voltage, positive supply voltage, or the like. The shared metal gate 74 of the column C5 is electrically isolated from the shared metal gate 74 of the column C6 by an isolation structure 88. The metal gate 74 of column C5 is coupled to a first reference voltage, positive supply voltage, or the like by a first word line contact 106, and the metal gate 74 of the column C6 is coupled to a second reference voltage, positive supply voltage, or the like by a second word line contact 106.

The semiconductor device 2400 may have a bit line to word line density ratio that is lower than a bit line to word line density ratio of the semiconductor device 1400 (described previously in FIGS. 24A through 24C). For example, the semiconductor device 2400 may have a bit line to word line density ratio that is 50 percent that of a bit line to word line density ratio of the semiconductor device 1400. This may free up space in the BEOL that can be utilized for another purpose.

FIG. 29A illustrates a cross-sectional view of a semiconductor device 2600 in accordance with an example embodiment of the present disclosure. The semiconductor device 2600 comprises a memory array that has a plurality of memory cells. Each memory cell comprises a MTJ coupled to a plurality of vertical TFTs formed in a Back End of Line (BEOL) of a fabrication process. The semiconductor device 2600 and the semiconductor device 1200 may be similar to the features discussed above with respect to FIG. 9 where like features are formed using like processes. Further description of these features is omitted for brevity.

A first interlayer dielectric (ILD) 75 deposited over the structure illustrated in FIG. 9. The first ILD 75 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

Next, a photoresist 188 may be deposited over the first ILD 75, which is then patterned to form a desired pattern. This can be achieved, for example, by blanket depositing a photosensitve layer (e.g., through sputtering or the like) and patterning the photosensitive layer through photolithography. For example, patterning the photoresist 188 may be performed using a combination of exposure, development, and/or cleaning processes.

FIG. 29B illustrates the use of the patterned photoresist 188 as an etching mask to etch the first ILD 75 and the top electrode 84. The pattern of the photoresist 188 is transferred to the first ILD 75 and the top electrode 84. After the etching, portions of the top electrode 84 remain over top surfaces of the semiconductor layer 80, the gate dielectric 76 and the dielectric layer 73. The remaining photoresist 188 can then be removed by a suitable method (e.g. ashing). The bottom electrode 70 and the top electrode 84 form a source and drain for each vertical TFT 89. The vertical TFTs 89 are electrically connected through the top electrode 84. The cross-sectional view illustrated in FIG. 29B shows the TFTs 89 having a channel made from the semiconductor layer 80 which comprises a thin-film oxide semiconductor.

Figure 29D:
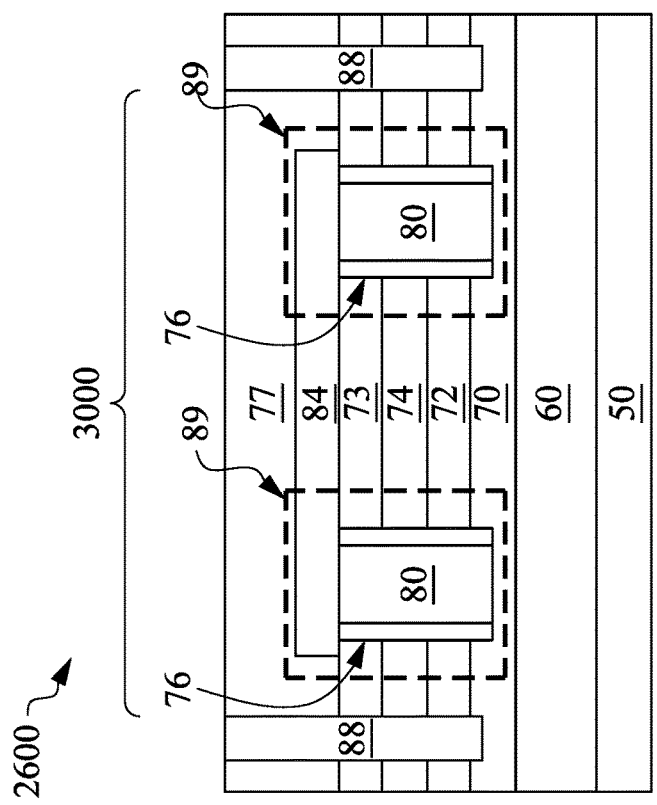
Figure 29C:
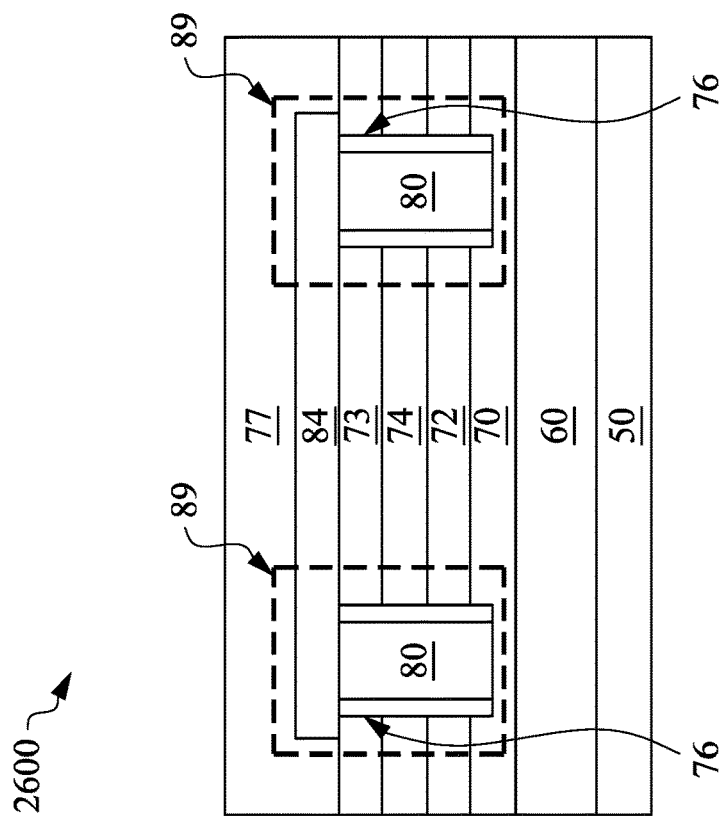

FIG. 29C illustrates forming of the second ILD 77 over the structure illustrated in FIG. 29B. The second ILD 77 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

FIG. 29D illustrates the formation of isolation structures 88 in accordance with some embodiments. In accordance with some embodiments of the present disclosure, the second ILD 77, the dielectric layer 73, the metal gate 74 and the dielectric layer 72 are etched to form trenches. In some embodiments, the trenches may extend to an intermediate level of the bottom electrodes 70. The trenches may be formed by using acceptable photolithography and etching techniques, for example. The trenches may then be filled with a dielectric material which may be silicon nitride, silicon oxide, silicon oxynitride, or the like, and may be formed by an ALD, CVD, or the like process. Subsequently, a planarization process, such as a CMP, may be performed to remove excess dielectric material from a surface of the second ILD 77, thus defining the isolation structures 88. The isolation structures 88 extend along a lengthwise direction, which is perpendicular to the lengthwise direction of the metal gate 74. The isolation structures 88 extend through the metal gate 74 and electrically isolate a portion of the metal gate 74 in a first region 3000 that is bound by the isolation structures 88.

Figure 29F:
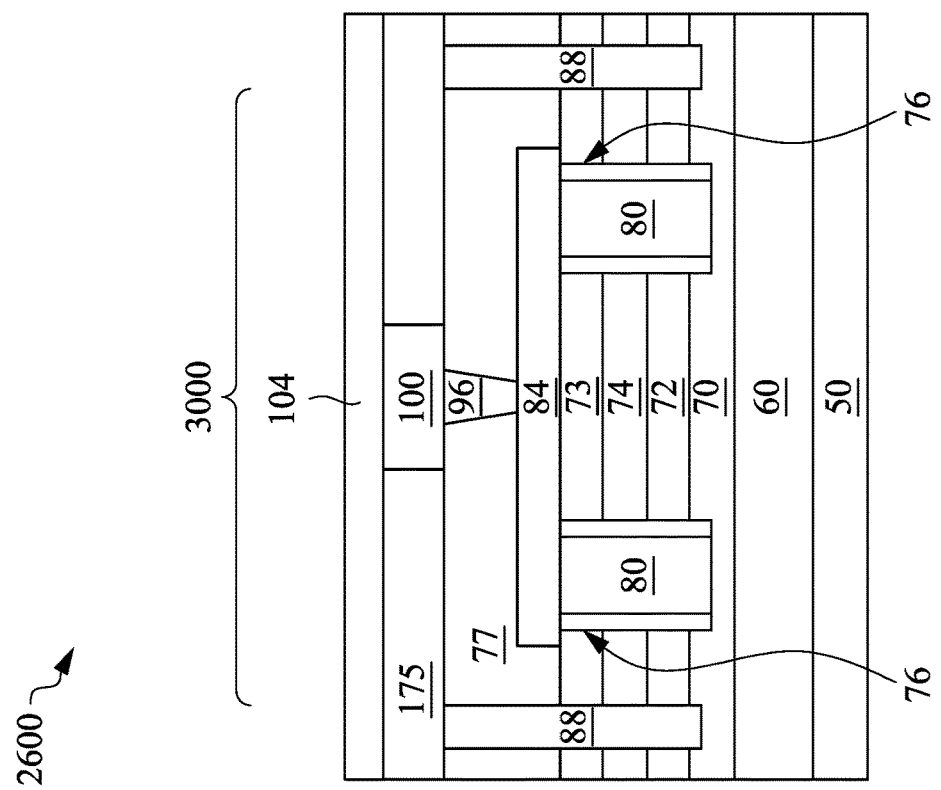
Figure 29E:
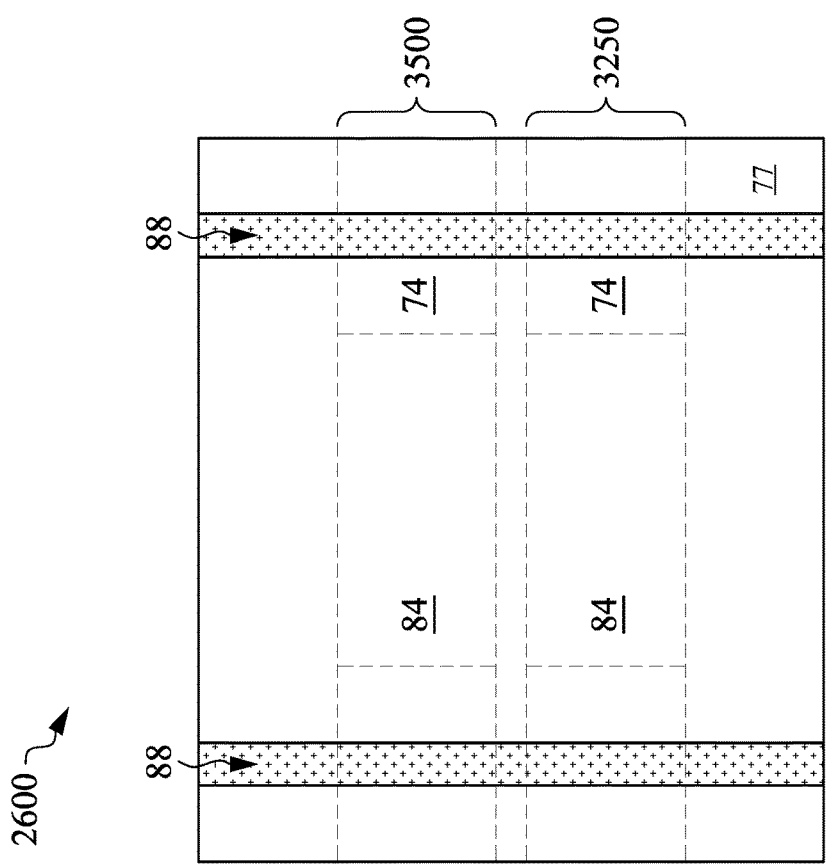

FIG. 29E illustrates a top-view of the semiconductor device 2600 after the formation of the isolation structures 88. In FIG. 29E, the location of the metal gates 74 and the top electrodes 84 is shown in ghost. The first metal gate 74 in the second region 3250 is electrically isolated from the second metal gate 74 in the third region 3500. TFTs 89 in the second region 3250 share the first metal gate 74 which functions as a first word line and TFTs 89 in the third region 3500 share the second metal gate 74 which functions as a second word line. In addition, TFTs 89 in the second region 3250 share a first top electrode 84 and TFTs 89 in the third region 3500 share a second top electrode 84.

FIG. 29F illustrates the formation of a contact via 96 through the second ILD 77 in accordance with some embodiments. An opening for the contact via 96 is formed through second ILD 77 to expose the top electrode 84. The opening may be formed using acceptable photolithography and etching techniques. A conductive material is formed in the opening that may comprise titanium nitride, tungsten, tantalum nitride, or the like. A planarization process, such as a CMP, may be performed to remove excess material from a surface of the second ILD 77. The remaining conductive material forms the contact via 96 in the opening. In some embodiments, a barrier layer may be formed in the opening prior to forming the conductive material. The barrier layer may comprise TiN, TaN, or the like.

Next, a memory stack is formed over the second ILD 77 and the contact via 96. The memory stack may comprise an MRAM magnetic tunnel junction (MTJ) stack, which may include a pinned magnetic layer, a free magnetic layer, and a tunneling non-magnetic barrier layer between the pinned magnetic layer and the free magnetic layer. Each of the pinned magnetic layer and the free magnetic layer comprises a suitable magnetic material(s), such as cobalt iron boron (CoFeB), cobalt iron (CoFe), nickel iron (NiFe), a synthetic magnetic material comprising Co/Ru/Co, or the like. In an embodiment, the tunneling non-magnetic barrier layer comprises magnesium oxide (MgO). Each of layers may be formed by way of deposition processes such as CVD, PVD, atomic layer deposition (ALD), or the like.

Next, a mask layer may be deposited over the memory stack. The mask layer may be a hard mask layer, comprising for example, silicon nitride, silicon oxynitride, or the like. The mask layer may be patterned according to a subsequently formed photoresist layer over the mask layer that may be patterned using lithographic methods.

Next, the memory element 100 is formed by using the patterned mask layer as an etching mask to etch the memory stack. The pattern of the mask layer is transferred to the memory stack. After the etching, the memory element 100 remains over top surfaces of the second ILD 77 and the contact via 96. The remaining mask layer can then be removed by a suitable method (e.g., ashing). The memory element 100 is electrically connected to two vertical TFTs 89 in the first region 3000 that provide a drive current for the memory element 100. The two TFTs 89 are connected to each other in parallel. In some embodiments, the steps required for the forming of the conductive feature 90 (shown previously in FIGS. 14 through 15) are not performed and the two vertical TFTs 89 that provide the drive current for the memory element 100 of each memory cell are electrically connected to the memory element 100 through the contact via 96 and the top electrode 84. This may simplify the process for forming the semiconductor device 2600 and may lead to reduced manufacturing costs.

Next, a third ILD 175 is deposited over the memory element 100 and the second ILD 77. The third ILD 175 surrounds the memory element 100. The third ILD 275 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The third ILD 175 may be formed of the same material as the first ILD 75 and the second ILD 77. The third ILD 175 may subsequently have its thickness reduced by use of a planarization process, such as a CMP for example.

A bit line 104 is then formed in the third ILD 175, in accordance with some embodiments. The bit line 104 may comprise a conductive strip. More than one bit line 104 may be formed, in accordance with embodiments. Although the bit line 104 is illustrated as being over the third ILD 175, the bit line 104 and the third ILD 175 may have top surfaces that are substantially level (e.g., within manufacturing tolerances). Trenches may be formed in the third ILD 175. The trenches may be formed using acceptable photolithography and etching techniques. The trenches may then be filled with a conductive material using CVD, physical vapor deposition (PVD), electro-chemical plating (ECP), electroless plating, or the like. The conductive material may comprise a material such as Cu, Al, Ti, Ta, W, Pt, Ni, Cr, Ru, TiN, TaN, combinations thereof, multilayers thereof, or the like. Any excess conductive material may be removed by, for example, a planarization process such as a chemical mechanical polish (CMP) process. The bit line 104 extends along a lengthwise direction, which is parallel to the lengthwise direction of the metal gate 74. Each bit line 104 is coupled to a memory element 100 of the semiconductor devices 2600.

Figure 29G:
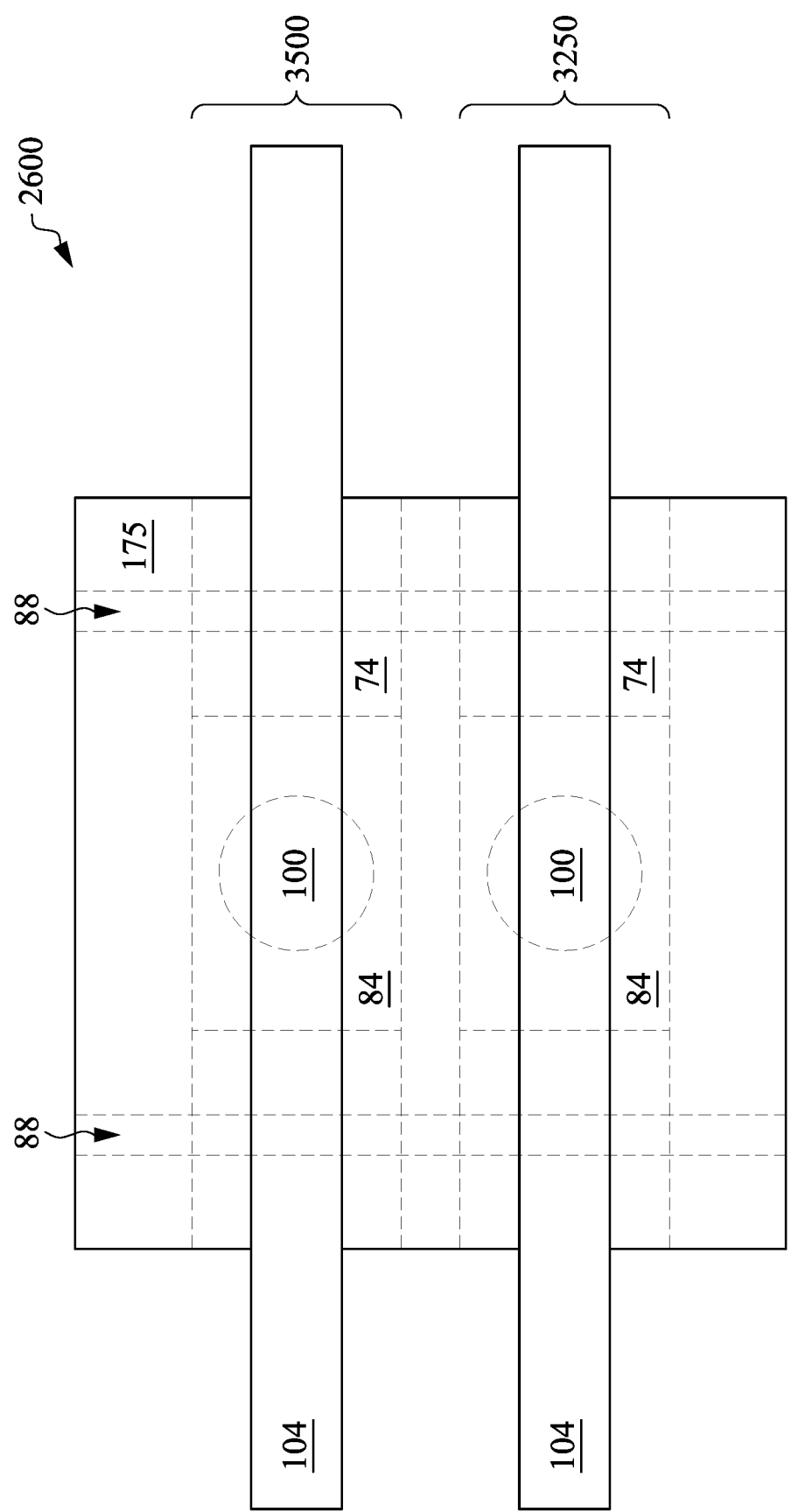

FIG. 29G illustrates a top-view of the semiconductor device 2600 after the formation of the bit lines 104. The semiconductor device 2600 comprises a first memory cell adjacent to a second memory cell, each of which is coupled to a separate bit line 104, in the form of a conductive strip. In FIG. 29G, the location of the metal gates 74, the memory elements 100, the isolation structures 88 and the top electrodes 84 is shown in ghost. Although two memory cells are illustrated in FIG. 29G, any number of memory cells can be formed. Each memory element 100 of a memory cell is electrically connected through the contact via 96 and the top electrode 84 to two vertical TFTs 89 that provide a drive current to the memory element 100. The two TFTs 89 of each memory cell are connected to each other in parallel. The two TFTs 89 of the first memory cell are electrically connected to a first bottom electrode 70, in the form of a strip, and the two TFTs 89 of the second memory cell are electrically connected to a second bottom electrode 70, in the form of a strip. The first bottom electrode 70 and the second bottom electrode 70 of the adjacent memory cells function as source lines. The first metal gate 74 in the second region 3250 functions as a first word line and is electrically connected to a first reference voltage, positive supply voltage, or the like by a first word line contact 106 and the second metal gate 74 in the third region 3500 functions as a second word line and is electrically connected to a second reference voltage, positive supply voltage, or the like by a second word line contact 106.

Figure 30A:
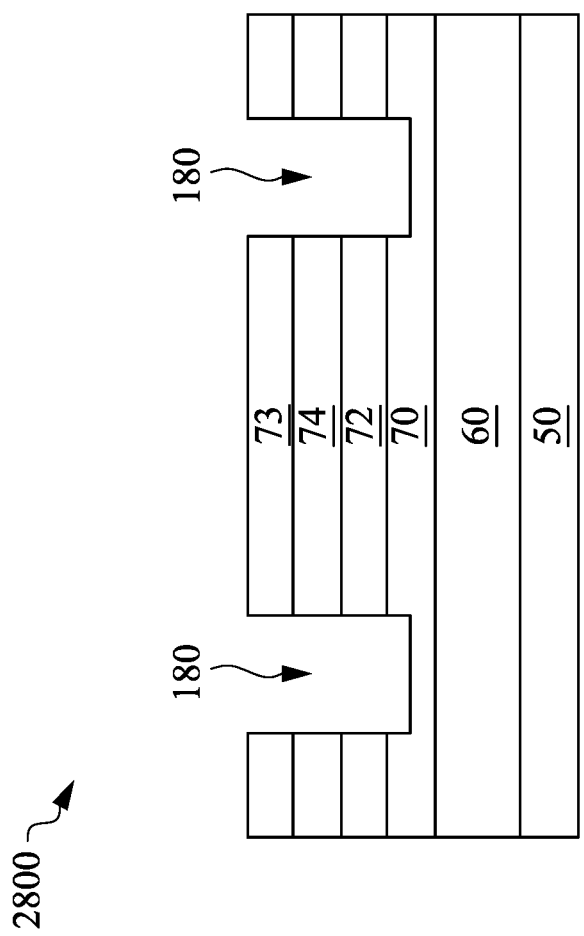
FIGS. 30A through 30B are various views of intermediate stages in the manufacturing of a semiconductor device, in accordance with some embodiments.

FIG. 30A illustrates a cross-sectional view of a semiconductor device 2800. The semiconductor device 2800 may be similar to semiconductor device 2400 of FIG. 28 where like reference numerals indicate like elements formed using like processes. The bottom electrodes 70 are formed in the insulation material 60 in accordance with some embodiments. The bottom electrodes 70 may be in the form of one or more conductive strips, that are patterned to form parallel electrical connections to the four vertical TFTs 89 that provide a drive current to each memory element 100 of each memory cell. Trenches are formed in the insulation material 60. The trenches may be formed using acceptable photolithography and etching techniques. A conductive material 65 may then be deposited in the trenches using CVD, physical vapor deposition (PVD), atomic layer deposition (ALD), electro-chemical plating (ECP), electroless plating, or the like. The conductive material 65 may be formed of conductive materials such as Cu, Al, Ti, Ta, W, Pt, Ni, Cr, Ru, TiN, TaN, combinations thereof, multilayers thereof, or the like.

A planarization process, such as a CMP, may be performed to remove excess conductive material 65 from a surface of the insulation material 60. The remaining conductive material 65 forms the bottom electrodes 70 in the trenches.

A conductive metal gate 74 is then formed in a dielectric layer 72. The dielectric layer 72 is formed over the bottom electrode 70, and may comprise silicon oxide, or a nitride (e.g., silicon nitride, or silicon carbon nitride, or the like) an oxynitride, or the like formed by a CVD, PVD, ALD, or other suitable process. Next, a trench is formed through the dielectric layer 72. The trench may be formed by acceptable photolithography and etching techniques, such as a damascene patterning process. A conductive material may be then deposited in the trench to form the conductive metal gate 74. The metal gate 74 may comprise a metal-containing material such as Cu, Al, Ti, Ta, W, Pt, Ni, Cr, Ru, TiN, TaN combinations thereof, or the like and may be formed by a CVD, PVD, ALD, or other suitable process. A planarization process, such as a CMP, may be performed to remove excess conductive material from a surface of the dielectric layer 72. The remaining conductive material forms the metal gate 74 in the trench. A dielectric layer 73 is then formed over the metal gate 74 and the gate dielectric layer 72 and may be formed of a similar material and in a similar manner as the dielectric layer 72. The dielectric layer 72 may have a same or a different material composition as the dielectric layer 73.

Figure 30B:
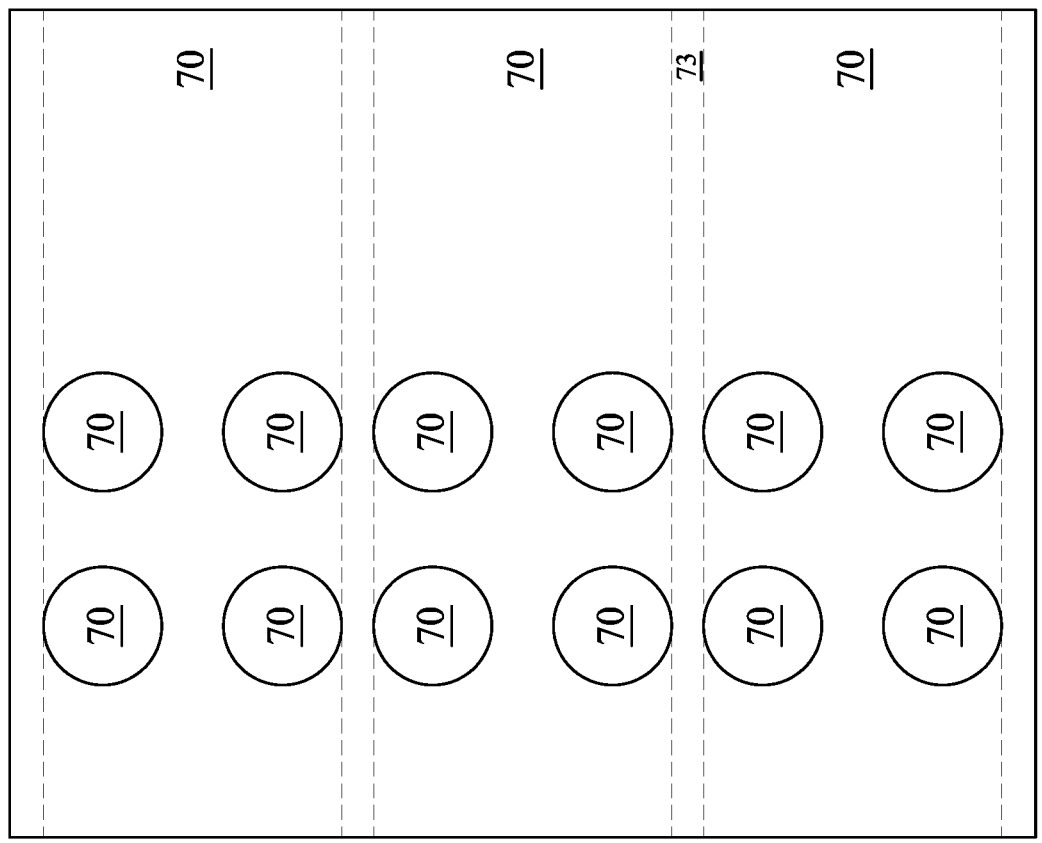

Next, openings 180 may be formed in the dielectric layer 73, the conductive metal gate 74, the dielectric layer 72, and the bottom electrodes 70. The openings 180 may be formed using acceptable photolithography and etching techniques. For example, anisotropic etching can be used to form the openings 180 that extend through the dielectric layer 73, the metal gate 74, the dielectric layer 72, and into the bottom electrodes 70. After forming the openings 180, top surfaces of the bottom electrodes 70 are exposed. For example, FIG. 30B illustrates a top-view of the semiconductor device 2800 after the formation of four openings 180 over each of the bottom electrodes 70 in order expose top surfaces of the bottom electrodes 70. In FIG. 30B, the location of the bottom electrodes 70 is shown in ghost. Although each of the bottom electrodes 70 is shown forming parallel connections to four vertical TFTs 89, the bottom electrode 70 can form a parallel connection to any number of vertical TFTs 89 in alternative embodiments.

Figure 30C:
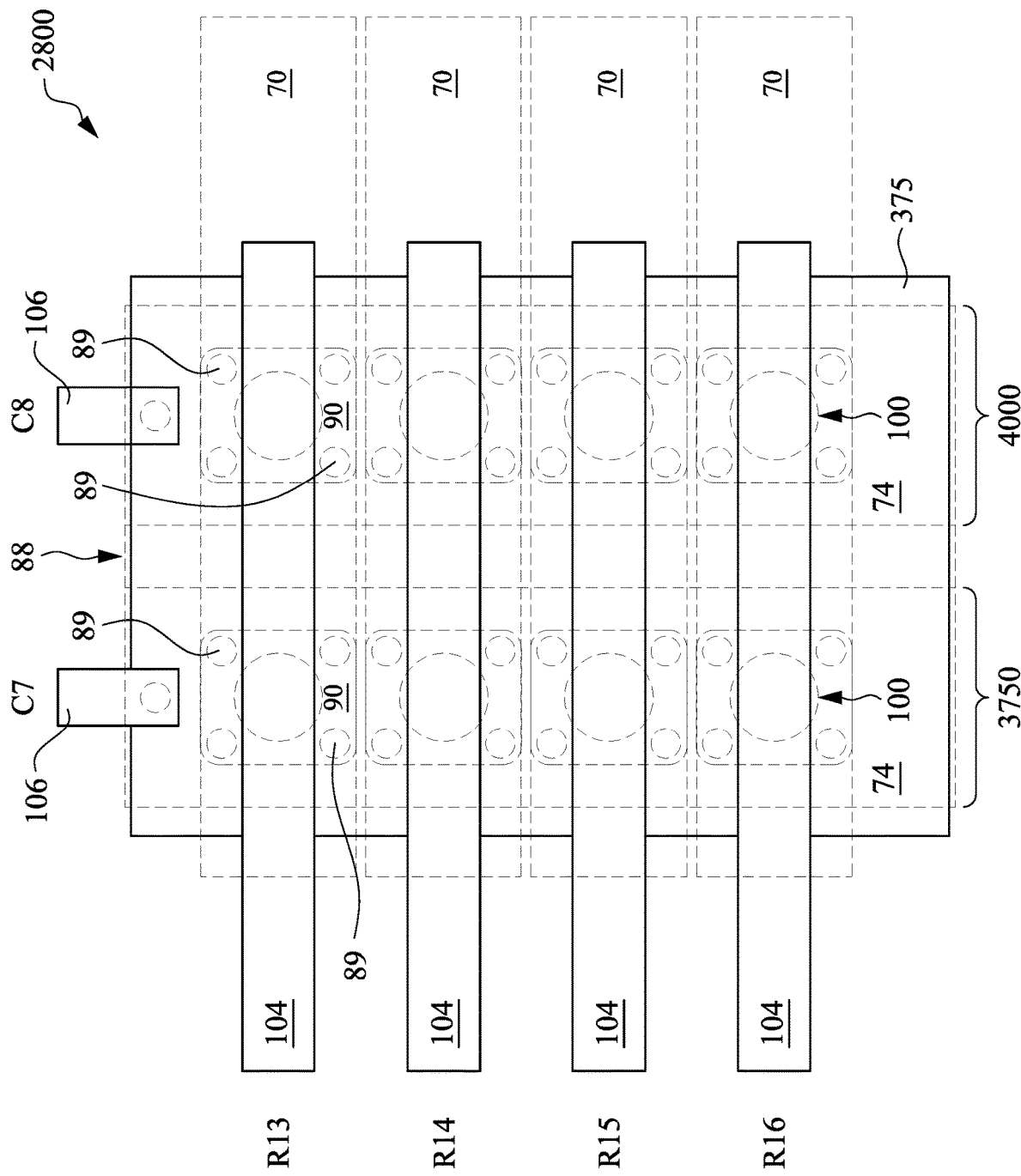
FIG. 30C illustrates a top-view of the semiconductor device illustrated in FIGS. 30A through 30B, in accordance with an embodiment.

FIG. 30C illustrates a top view of a semiconductor device 2800 in accordance with an example embodiment of the present disclosure. The semiconductor device 2800 includes a memory array arranged in rows (R13, R14, R15, and R16) and columns (C7 and C8). Although four rows and two columns are illustrated in FIG. 30C, any number of rows and columns can be formed. In FIG. 30C, the location of the metal gates 74, the memory elements 100, the TFTs 89, the bottom electrodes 70, the isolation structure 88, and the conductive feature 90 is shown in ghost. Each memory element 100 is electrically connected to four vertical TFTs 89 arranged in a rectangular array in a 2 rows and 2 columns (2×2) configuration that provide a drive current for the memory element 100 in a similar manner as that described previously in FIGS. 27A through 27D. In alternative embodiments, any number of vertical TFTs 89 arranged in different configurations can be used to provide a drive current for each memory element 100.

All vertical TFTs 89 in the column C7 that provide the drive current for memory elements 100 in the column C7 share a common metal gate 74 in the first region 3750. All vertical TFTs 89 in the column C8 that provide the drive current for memory elements 100 in the column C8 share a common metal gate 74 in the second region 4000. Memory elements 100 that are in the same row and in adjacent columns C7 and C8 are coupled to the same bit line 104. All four TFTs 89 of every memory cell that are coupled to memory elements 100 in the same row and in adjacent columns C7 and C8 are electrically connected to the same bottom electrode 70, in the form of a conductive strip. Each bottom electrode 70 functions as a source line. This may simplify the process for forming the semiconductor device 2800 and may reduce manufacturing costs. The shared metal gate 74 in the first region 3750 of the column C7 is electrically isolated from the shared metal gate 74 in the second region 4000 of the column C8 by an isolation structure 88. The metal gate 74 in the first region 3750 of column C7 functions as a first word line and is electrically connected to a first reference voltage, positive supply voltage, or the like by a first word line contact 106, and the metal gate 74 in the second region 4000 of the column C8 functions as a second word line and is electrically connected to a second reference voltage, positive supply voltage, or the like line by a second word line contact 106.

The semiconductor device 2800 may have a bit line to word line density ratio that is lower than a bit line to word line density ratio of the semiconductor device 1400 (shown previously in FIGS. 24A through 24C). For example, the semiconductor device 2800 may have a bit line to word line density ratio that is 50 percent that of a bit line to word line density ratio of the semiconductor device 1400. This may free up space in the BEOL that can be utilized for another purpose.

Figure 31:
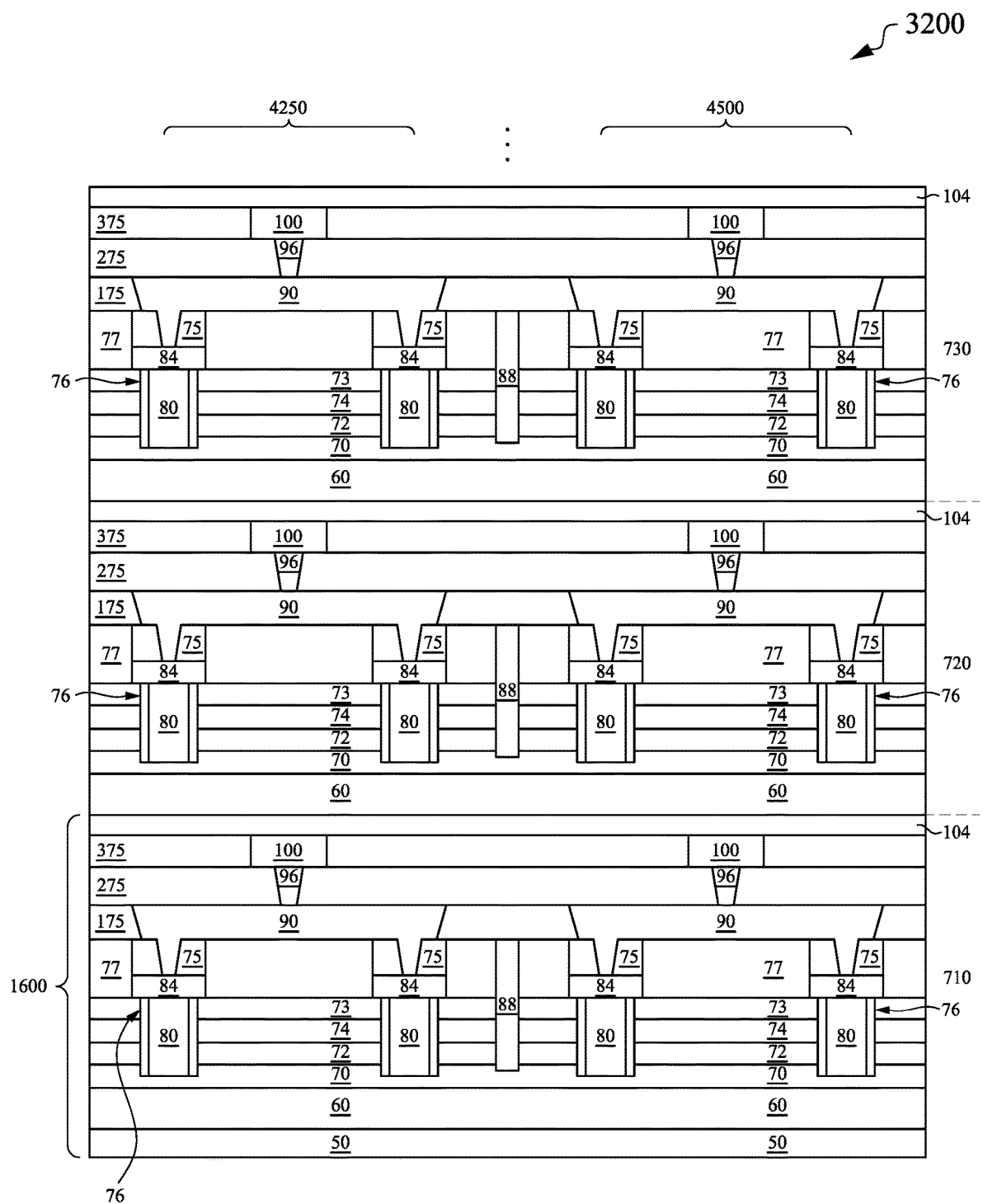
FIG. 31 illustrates a cross-sectional view of a semiconductor device, in accordance with an embodiment.

FIG. 31 illustrates a cross-sectional view of a semiconductor device 3200. Semiconductor device 3200 may be similar to semiconductor device 1600 of FIGS. 25A through 25B where like reference numerals indicate like elements formed using like processes. The semiconductor device 3200 comprises a monolithic integrated multi-stack memory device that comprises two or more storage units that are vertically stacked on a substrate 50 to form a plurality of storage unit rows. Each of the storage units may comprise a memory array that includes the semiconductor device 1600 (shown previously in FIGS. 25A through 25B). In alternate embodiments, the monolithic integrated multi-stack memory device may comprise two or more other memory arrays that are vertically stacked to form a plurality of storage unit rows.

The bottommost storage unit 710 comprises the semiconductor device 1600 which includes a memory array formed on the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In some embodiments, there are no active devices (e.g., transistors) at the Front End of Line (FEOL) (e.g., on a top surface of the substrate 50). In some embodiments of the present disclosure, substrate 50 may comprise a logic region that comprises of one or more logic devices (e.g., active devices for integration into logic circuits, resistor devices comprising MTJs, or the like) formed over a semiconductor substrate. The logic region can be formed in a FEOL fabrication process. Subsequently, MRAM cells of a memory array can then be formed over the logic region in a BEOL fabrication process.

Once the bottommost storage unit 710 is formed, subsequent storage units (e.g., 720, 730 . . . ) may be vertically stacked and bonded over the bottommost storage unit 710. Storage unit 720 may comprise a memory array that includes insulation material 60 formed over the fifth ILD 375 and the bit line 104 of the bottommost storage unit 710. The insulation material 60 may be an oxide, such as silicon oxide, a nitride, the like, or a combination thereof, and may be formed by a chemical vapor deposition CVD process, or the like. Other insulation materials formed by any acceptable process may be used. The manner of formation of storage unit 720 is repeated for the formation of subsequent vertically stacked storage units of the multi-stack memory. Any number of vertically stacked storage units may be included in the multi-stack memory.

FIG. 31 also shows that each storage unit (e.g., 710, 720, 730 . . . ) is a memory array that may be arranged in rows and columns. In FIG. 31, although two memory cells are shown in each row of each storage unit (e.g., 710, 720, 730 . . . ), any number of rows that comprise any number of memory cells can be formed in each storage unit. In addition, any number of columns that comprise any number of memory cells can be formed in each storage unit. Each row comprises a plurality of memory cells, where each memory cell includes a memory element 100. Memory elements 100 in the same row of each storage unit are coupled to a single bit line 104. TFTs 89 coupled to the memory elements 100 of each row of a storage unit are electrically connected to a single bottom electrode 70, which functions as a source line. The two TFTs 89 that provide the drive current for each memory element 100 of a storage unit are connected to each other in parallel and also share a common metal gate 74. The metal gate 74 in a first region 4250 of each storage unit functions as a first word line and the metal gate 74 in the second region 4500 of each storage unit functions as a second word line. The bit lines 104, the word lines, and source lines of the different storage units (e.g., 710, 720, 730 . . . ) are in different levels of the BEOL. To electrically connect the bit lines 104, the metal gates 74 (word lines), and the bottom electrodes 70 (source lines) to different reference voltages, positive supply voltages, or the like, staircase routing is used to form a terrace structure that exposes the bit lines 104, the metal gates 74 (word lines), and the bottom electrodes (source line) of each storage unit in a stair-step pattern.

The embodiments of the present disclosure have some advantageous features. Forming a plurality of oxide semiconductor vertical thin-film transistors (TFTs) connected in parallel as access transistors to provide a drive current for memory technologies at low temperatures in the Back End of Line (BEOL) of a fabrication process may include the ability to allow for the customization of device parameters such as the drive current, allowing for the ability to meet requirements to drive different types of memory technologies and reducing manufacturing costs. Higher available drive currents can be achieved by using a plurality of vertical TFTs in different configurations. The oxide semiconductor TFTs have channel materials that are characterized by relatively low leakage currents and higher on-off ratios than silicon based transistors. In addition, since the memory array is formed at the BEOL (e.g., in the interconnect layers) instead of the Front End of Line (FEOL) (e.g., on a top surface of a semiconductor substrate), additional space in the FEOL is available for another purpose and therefore allows for a higher integration density. Further, the embodiments also allow for the formation of multi-stack memory arrays in the BEOL through the use of monolithic integration.

In accordance with an embodiment, a semiconductor device includes a first dielectric layer over a substrate; and a first access transistor and a second access transistor in a memory cell of a memory array, the first access transistor and the second access transistor each including a bottom electrode in the first dielectric layer; a conductive gate in a second dielectric layer, where the second dielectric layer is over the bottom electrode and the first dielectric layer; a channel region extending through the conductive gate to contact the bottom electrode; and a top electrode over the channel region. In an embodiment, the channel region includes a thin-film oxide semiconductor. In an embodiment, the channel region includes indium-gallium-oxide (IGO), zinc oxide (ZnO), indium-gallium-zinc-oxide (IGZO), or indium-tungsten-oxide (IWO). In an embodiment, the semiconductor device further includes a gate dielectric layer on sidewalls of the channel region, the gate dielectric layer being between the channel region and the conductive gate. In an embodiment, current in a respective channel region of the first access transistor travels in a direction perpendicular to a top surface of a respective bottom electrode of the first access transistor when the first access transistor is in an on-state. In an embodiment, the semiconductor device further includes an isolation structure that electrically isolates the conductive gate of the first access transistor from the conductive gate of the second access transistor. In an embodiment, the conductive gate of the first access transistor is a portion of a first word line and the conductive gate of the second access transistor is a portion of a second word line. In an embodiment, the semiconductor device further includes a word line contact that electrically connects the conductive gate of the first access transistor and the conductive gate of the second access transistor to a same reference voltage. In an embodiment, a bottom electrode of the first access transistor is connected to a bottom electrode of the second access transistor; and a conductive contact electrically connects a top electrode of the first access transistor to a top electrode of the second access transistor. In an embodiment, the conductive contact electrically connects the first access transistor and the second access transistor to a magnetic tunnel junction (MTJ).

In accordance with yet another embodiment, a semiconductor device includes a memory array over a substrate, the memory array including a first magnetic tunnel junction (MTJ) stack and a second MTJ stack; a first access transistor and a second access transistor electrically connected to the first MTJ stack; a third access transistor and fourth access transistor electrically connected to the second MTJ stack, where a channel region of each of the first, second, third, and fourth access transistors includes a thin-film oxide semiconductor, where respective channel regions of the first, second, third, and fourth access transistors each contact a first source line; and a bit line coupled to the first MTJ stack and the second MTJ stack. In an embodiment, the semiconductor device further includes a first top electrode over channel regions of the first access transistor and the second access transistor; and a second top electrode over channel regions of the third access transistor and the fourth access transistor. In an embodiment, the semiconductor device further includes a first conductive gate of the first and the second access transistors, where the first conductive gate is a portion of a first word line, where the first word line is electrically connected to a first reference voltage; and a second conductive gate of the third and the fourth access transistors, where the second conductive gate is a portion of a second word line, where the second word line is electrically connected to a second reference voltage. In an embodiment, the semiconductor device further includes a fifth access transistor and a sixth access transistor electrically connected to the first MTJ stack; and a seventh access transistor and an eighth access transistor electrically connected to the second MTJ stack, where channel regions of the fifth, sixth, seventh, and eighth access transistors contact a second source line. In an embodiment, the first source line and the second source line are electrically connected to a same reference voltage. In an embodiment, the semiconductor device further includes a fifth access transistor and a sixth access transistor electrically connected to the first MTJ stack; and a seventh access transistor and an eighth access transistor electrically connected to the second MTJ stack, where channel regions of the fifth, sixth, seventh, and eighth access transistors contact the first source line.

In accordance with an embodiment, a method includes depositing an insulation layer over a semiconductor substrate; forming a bottom electrode layer in the insulation layer; depositing a first dielectric layer over the bottom electrode layer and the insulation layer; forming a conductive gate layer in the first dielectric layer; depositing a second dielectric layer over the conductive gate layer and the first dielectric layer; etching through the second dielectric layer, the conductive gate layer, and the first dielectric layer to form a plurality of openings that expose top surfaces of the bottom electrode layer; depositing an oxide semiconductor layer in the plurality of openings to form channel regions of access transistors; and coupling the access transistors to one or more magnetic tunnel junctions (MTJs). In an embodiment, the method further includes forming a top electrode layer over the channel regions and the second dielectric layer; and patterning the top electrode layer such that portions of the top electrode layer remain over the channel regions and the second dielectric layer. In an embodiment, depositing the oxide semiconductor layer includes a process temperature that is less than 350° C. In an embodiment, the method further includes depositing a gate dielectric layer in the plurality of openings on sidewalls of the conductive gate layer and a top surface of the second dielectric layer; and removing horizontal portions of the gate dielectric layer on the top surface of the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first dielectric layer over a substrate; and
   a first access transistor and a second access transistor in a memory cell of a memory array, the first access transistor and the second access transistor each comprising:
      a bottom electrode in the first dielectric layer, wherein the bottom electrode comprises a conductive metal;
      a conductive gate in a second dielectric layer, wherein the second dielectric layer is over the bottom electrode and the first dielectric layer;
      a channel region extending through the conductive gate to be in physical contact with the bottom electrode; and
      a top electrode over the channel region;
   a magnetic tunnel junction (MTJ) disposed between the first access transistor and the second access transistor, wherein the MTJ does not overlap the channel region of the first access transistor or the channel region of the second access transistor; and an isolation structure disposed between the first access transistor and the second access transistor, wherein a bottom surface of the channel region of the first access transistor and a bottom surface of the channel region of the second access transistor are below a bottom surface of the isolation structure, and wherein the bottom surface of the isolation structure is in physical contact with the bottom electrode of the first access transistor.

2. The semiconductor device of claim 1, wherein the channel region comprises a thin-film oxide semiconductor.

3. The semiconductor device of claim 1, wherein the channel region comprises indium-gallium-oxide (IGO), zinc oxide (ZnO), indium-gallium-zinc-oxide (IGZO), or indium-tungsten-oxide (IWO).

4. The semiconductor device of claim 1, further comprising a gate dielectric layer on sidewalls of the channel region, the gate dielectric layer being between the channel region and the conductive gate, wherein a topmost surface of the second dielectric layer is level with a topmost surface of the conductive gate.

5. The semiconductor device of claim 1, wherein current in the channel region of the first access transistor travels in a direction perpendicular to a top surface of the bottom electrode of the first access transistor when the first access transistor is in an on-state.

6. The semiconductor device of claim 1, wherein the isolation structure electrically isolates the conductive gate of the first access transistor from the conductive gate of the second access transistor, and wherein the MTJ overlaps the isolation structure.

7. The semiconductor device of claim 6, wherein the conductive gate of the first access transistor is a portion of a first word line and the conductive gate of the second access transistor is a portion of a second word line.

8. The semiconductor device of claim 7 further comprising a word line contact that electrically connects the conductive gate of the first access transistor and the conductive gate of the second access transistor to a same reference voltage.

9. The semiconductor device of claim 1, wherein:
a bottom electrode of the first access transistor is connected to a bottom electrode of the second access transistor; and
a conductive contact electrically connects a top electrode of the first access transistor to a top electrode of the second access transistor.

10. The semiconductor device of claim 9, wherein the conductive contact electrically connects the first access transistor and the second access transistor to the MTJ.

11. A semiconductor device comprising:
a memory array over a substrate, the memory array comprising:
a first magnetic tunnel junction (MTJ) stack and a second MTJ stack;
a first access transistor and a second access transistor electrically connected to the first MTJ stack;
a third access transistor and fourth access transistor electrically connected to the second MTJ stack, wherein a channel region of each of the first, second, third, and fourth access transistors comprises a thin-film oxide semiconductor, wherein respective channel regions of the first, second, third, and fourth access transistors each physically contact a first source line, wherein the first source line comprises a conductive metal;
an isolation structure disposed between the first access transistor and the second access transistor, wherein the first MTJ stack overlaps the isolation structure, wherein bottom surfaces of channel regions of the first access transistor and the second access transistor are below a bottom surface of the isolation structure, and wherein the bottom surface of the isolation structure is in physical contact with the first source line; and
a bit line coupled to the first MTJ stack and the second MTJ stack.

12. The semiconductor device of claim 11, further comprising:
a first top electrode over and in physical contact with the channel regions of the first access transistor and the second access transistor; and
a second top electrode over and in physical contact with channel regions of the third access transistor and the fourth access transistor, wherein the first top electrode and the second top electrode comprise a conductive metal.

13. The semiconductor device of claim 12, further comprising:
a first conductive gate of the first and the second access transistors, wherein the first conductive gate is a portion of a first word line, wherein the first word line is electrically connected to a first reference voltage; and
a second conductive gate of the third and the fourth access transistors, wherein the second conductive gate is a portion of a second word line, wherein the second word line is electrically connected to a second reference voltage.

14. The semiconductor device of claim 13, further comprising:
a fifth access transistor and a sixth access transistor electrically connected to the first MTJ stack; and
a seventh access transistor and an eighth access transistor electrically connected to the second MTJ stack, wherein channel regions of the fifth, sixth, seventh, and eighth access transistors contact a second source line.

15. The semiconductor device of claim 14, wherein the first source line and the second source line are electrically connected to a same reference voltage.

16. The semiconductor device of claim 13, further comprising:
a fifth access transistor and a sixth access transistor electrically connected to the first MTJ stack; and
a seventh access transistor and an eighth access transistor electrically connected to the second MTJ stack, wherein channel regions of the fifth, sixth, seventh, and eighth access transistors contact the first source line.

17. A semiconductor device comprising:
a memory cell comprising:
a substrate:
a magnetic tunnel junction (MTJ) stack over the substrate;
a first vertical transistor and a second vertical transistor coupled in parallel to the MTJ stack, wherein each of the first vertical transistor and the second vertical transistor are configured such that currents in channel regions of the first vertical transistor and the second vertical transistor travel in a vertical direction in a plane perpendicular to a major surface of the substrate when the first vertical transistor and the second vertical transistor are in an on-state, wherein the first vertical transistor comprises a first metal electrode disposed over and in physical contact with a channel region of the first vertical transistor, and wherein the second vertical transistor comprises a second metal electrode disposed over and in physical contact with a channel region of the second vertical transistor;

an isolation structure disposed between the first vertical transistor and the second vertical transistor;

a metal contact overlapping and in physical contact with the isolation structure, the first metal electrode, and the second metal electrode;

a first dielectric layer over the metal contact;

a second dielectric layer over the first dielectric layer, wherein the MTJ stack extends through the second dielectric layer;

a contact via disposed between and in physical contact with the MTJ stack and the metal contact, wherein the contact via extends through the first dielectric layer; and a bit line over and electrically coupled to the MTJ stack and the metal contact.

18. The semiconductor device of claim 17, wherein the channel regions comprise a thin-film oxide semiconductor.

19. The semiconductor device of claim 17, wherein the channel regions comprise indium.

20. The semiconductor device of claim 17, wherein each of the first vertical transistor and the second vertical transistor further comprises:

a bottom electrode disposed below the channel region of the first vertical transistor or the second vertical transistor; and a gate dielectric layer surrounding the channel region of the first vertical transistor or the second vertical transistor.

* * * * *